(12) United States Patent
Sugiyama et al.

(10) Patent No.: US 11,328,655 B2
(45) Date of Patent: May 10, 2022

(54) DRIVE DEVICE AND DISPLAY APPARATUS

(71) Applicants: Sony Semiconductor Solutions Corporation, Kanagawa (JP); Sony Corporation, Tokyo (JP)

(72) Inventors: Takaaki Sugiyama, Kanagawa (JP); Ken Kikuchi, Tokyo (JP); Atsushi Yasuda, Kanagawa (JP); Hirokazu Imai, Tokyo (JP); Hiroshi Tobita, Kanagawa (JP)

(73) Assignees: Sony Semiconductor Solutions Corporation, Kanagawa (JP); Sony Corporation, Tokyo (JP)

( * ) Notice: Subject to any disclaimer, the term of this patent is extended or adjusted under 35 U.S.C. 154(b) by 188 days.

(21) Appl. No.: 16/490,097

(22) PCT Filed: Mar. 6, 2018

(86) PCT No.: PCT/JP2018/008524
§ 371 (c)(1),
(2) Date: Aug. 30, 2019

(87) PCT Pub. No.: WO2018/164105
PCT Pub. Date: Sep. 13, 2018

(65) Prior Publication Data
US 2021/0295766 A1 Sep. 23, 2021

(30) Foreign Application Priority Data
Mar. 6, 2017 (JP) .............................. JP2017-041965

(51) Int. Cl.
*G09G 3/32* (2016.01)

(52) U.S. Cl.
CPC ....... *G09G 3/32* (2013.01); *G09G 2300/0814* (2013.01); *G09G 2310/027* (2013.01);
(Continued)

(58) Field of Classification Search
CPC ............. G09G 3/32; G09G 2310/0216; G09G 2310/027; G09G 2300/0814; G09G 2320/0266
See application file for complete search history.

(56) References Cited

U.S. PATENT DOCUMENTS 5,844,535 A   12/1998 Itoh et al.
8,836,615 B2   9/2014 Schemmann et al.
(Continued)

FOREIGN PATENT DOCUMENTS

CN   1435809 A   8/2003
CN   1698084 A   11/2005
(Continued)

OTHER PUBLICATIONS

International Search Report and English translation thereof dated Jun. 5, 2018 in connection with International Application No. PCT/JP2018/008524.

*Primary Examiner* — Andrew Sasinowski
(74) *Attorney, Agent, or Firm* — Wolf, Greenfield & Sacks, P.C.

(57) ABSTRACT

A display apparatus according to an embodiment of the present disclosure includes: a display panel including a plurality of pixels; and a drive device that outputs a driving signal to the display panel. The driving signal causes one of the pixels to emit light many times by an active PWM drive method in a 1-frame period.

19 Claims, 22 Drawing Sheets

(52) U.S. Cl.
   CPC ............ *G09G 2310/0216* (2013.01); *G09G 2320/0266* (2013.01)

(56) References Cited

U.S. PATENT DOCUMENTS

| | | |
|---|---|---|
| 2005/0156828 A1 | 7/2005 | Yamashita et al. |
| 2010/0039454 A1 | 2/2010 | Nakamura et al. |
| 2014/0218272 A1* | 8/2014 | Kikuchi ............ G09G 3/3258 345/77 |
| 2016/0343305 A1 | 11/2016 | Kamiyamaguchi et al. |
| 2017/0270866 A1 | 9/2017 | Asano |

FOREIGN PATENT DOCUMENTS

| | | |
|---|---|---|
| CN | 103971633 A | 8/2014 |
| CN | 108335674 A | 7/2018 |
| JP | 09-005789 A | 1/1997 |
| JP | 2000-267066 A | 9/2000 |
| JP | 2003-241711 A | 8/2003 |
| JP | 2010-044250 A | 2/2010 |
| JP | 2015-004945 A | 1/2015 |
| JP | 2015-092529 A | 5/2015 |
| WO | 2007/134991 A2 | 11/2007 |
| WO | 2015/111118 A1 | 7/2015 |
| WO | 2016/103896 A1 | 6/2016 |

\* cited by examiner

[ FIG. 1 ]
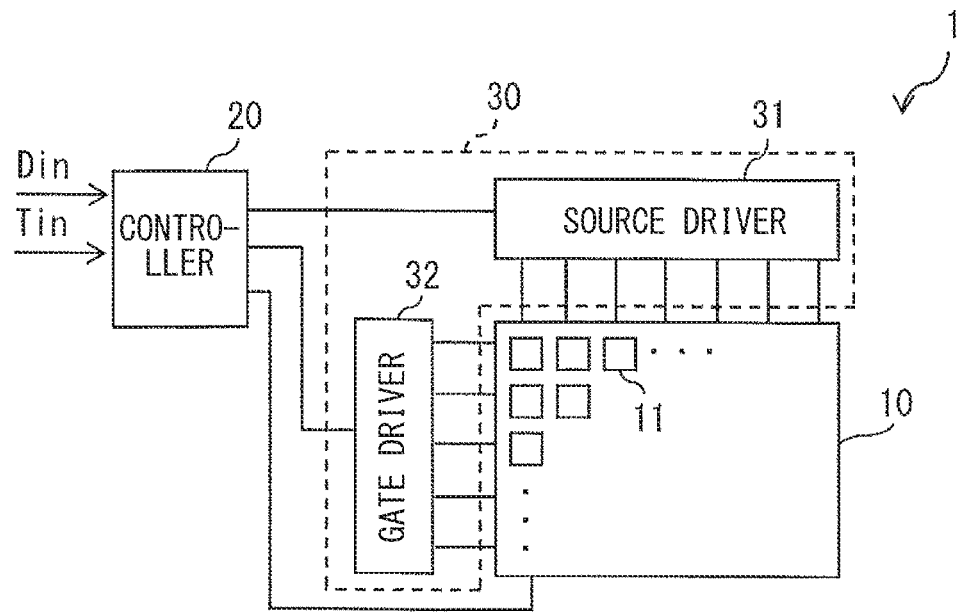
[ FIG. 2 ]
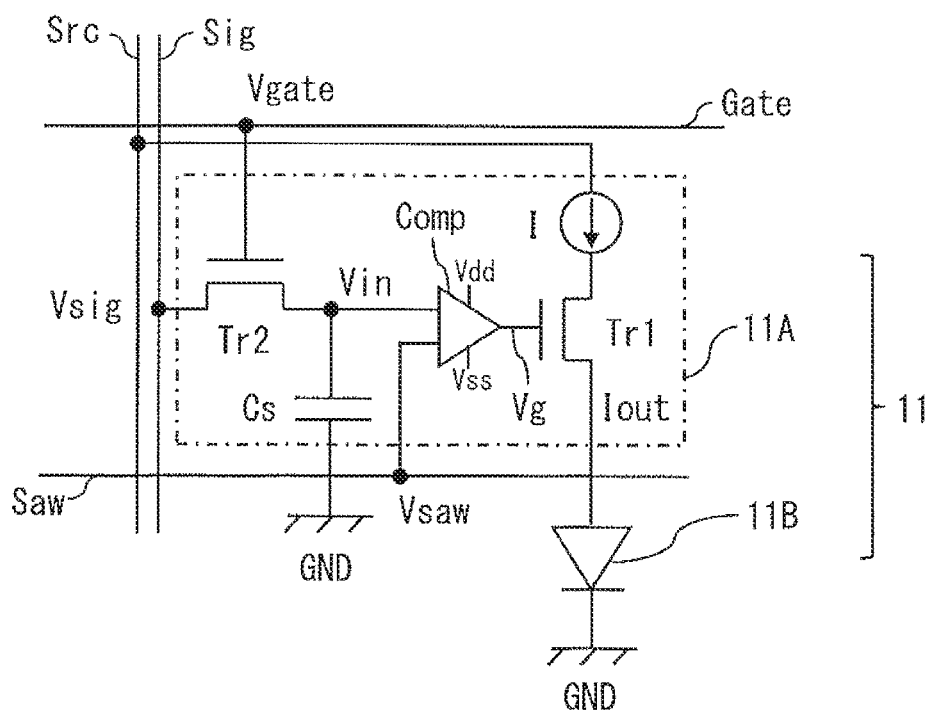

[FIG. 3]
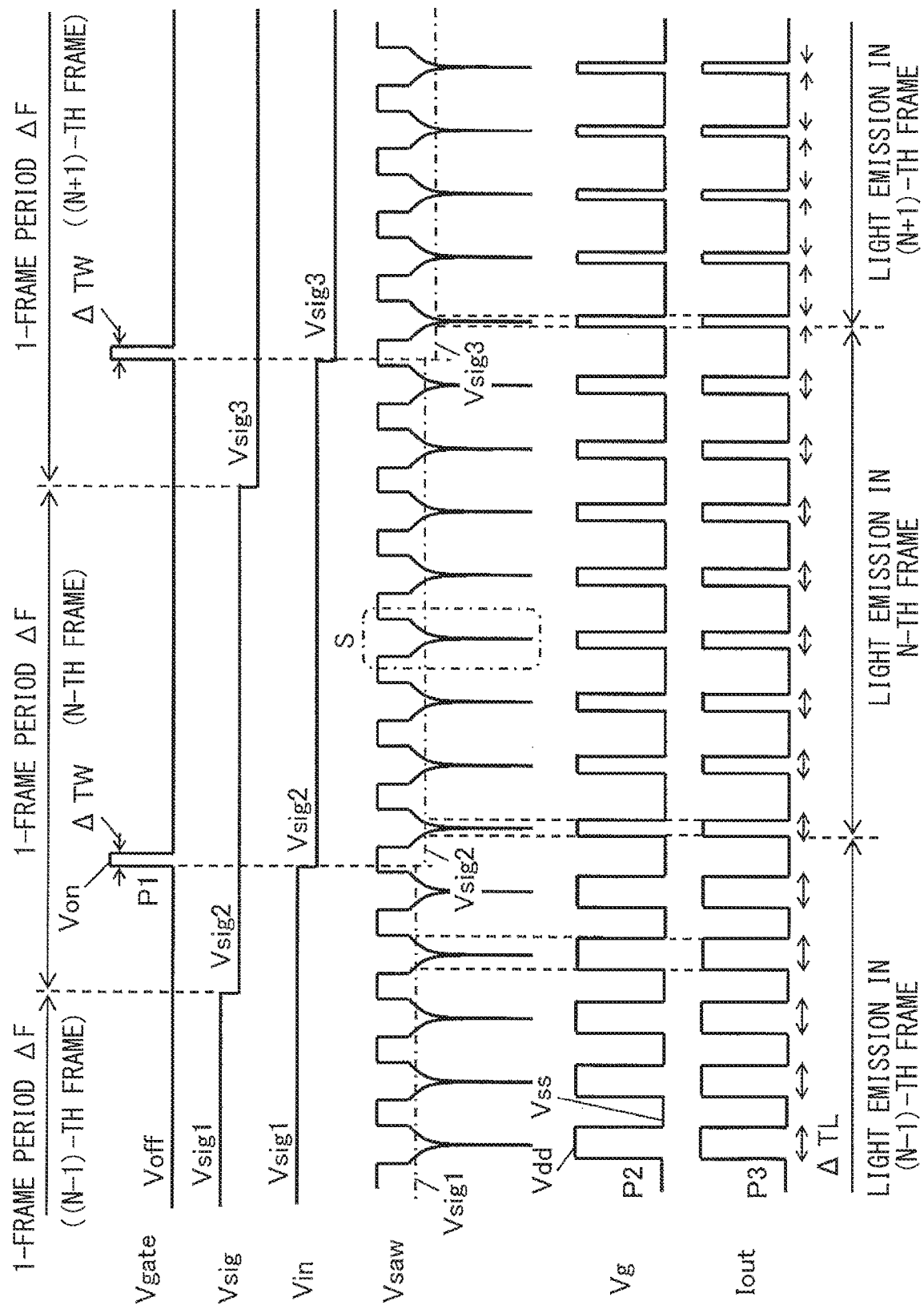

[ FIG. 4 ]
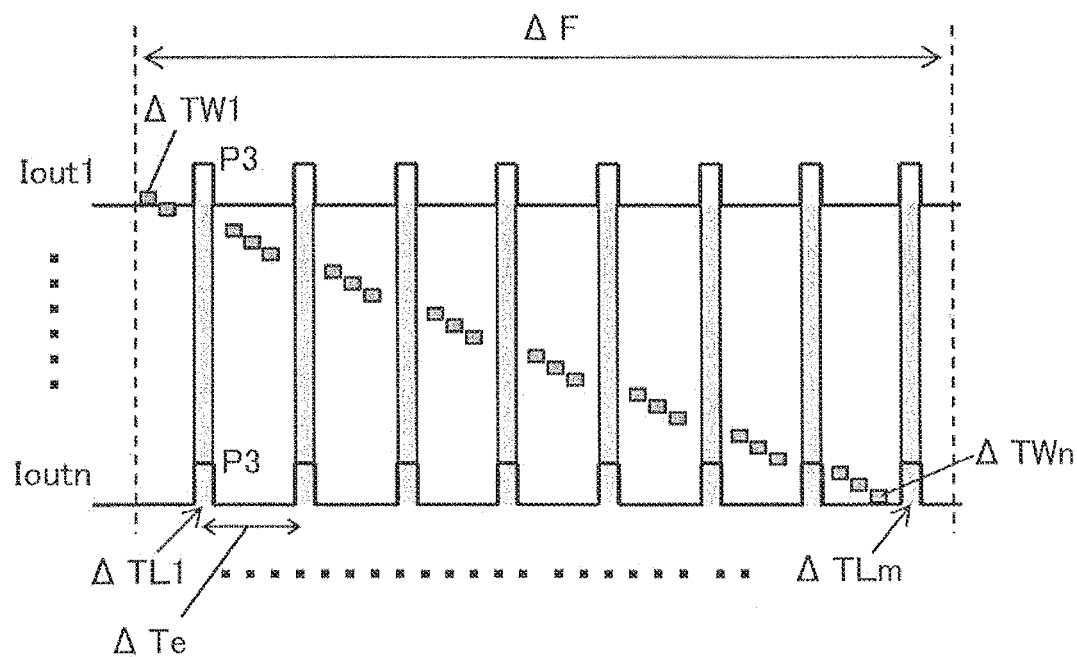
[ FIG. 5 ]
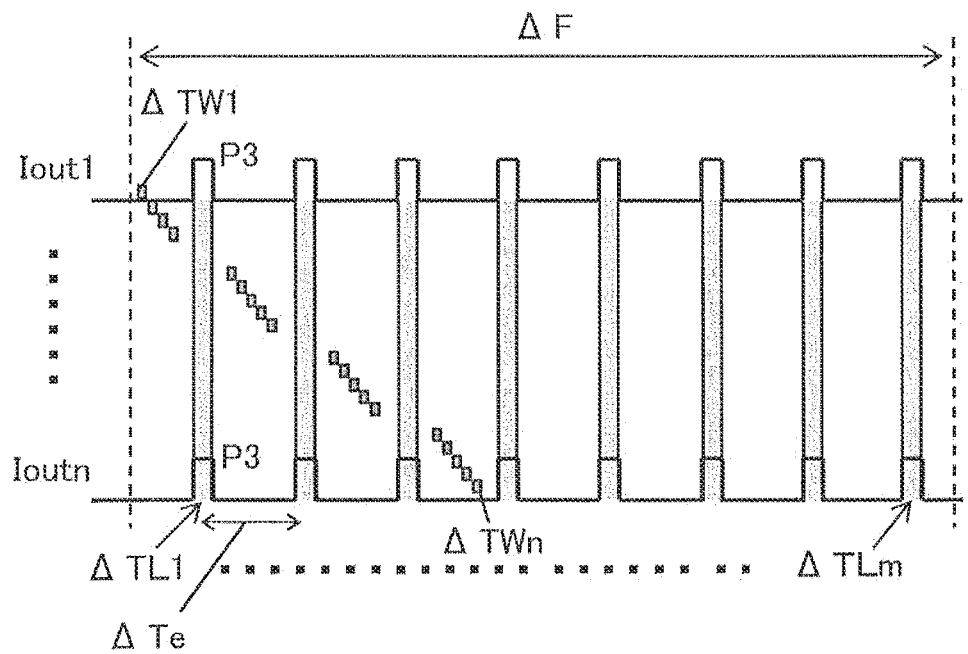

[ FIG. 6 ]
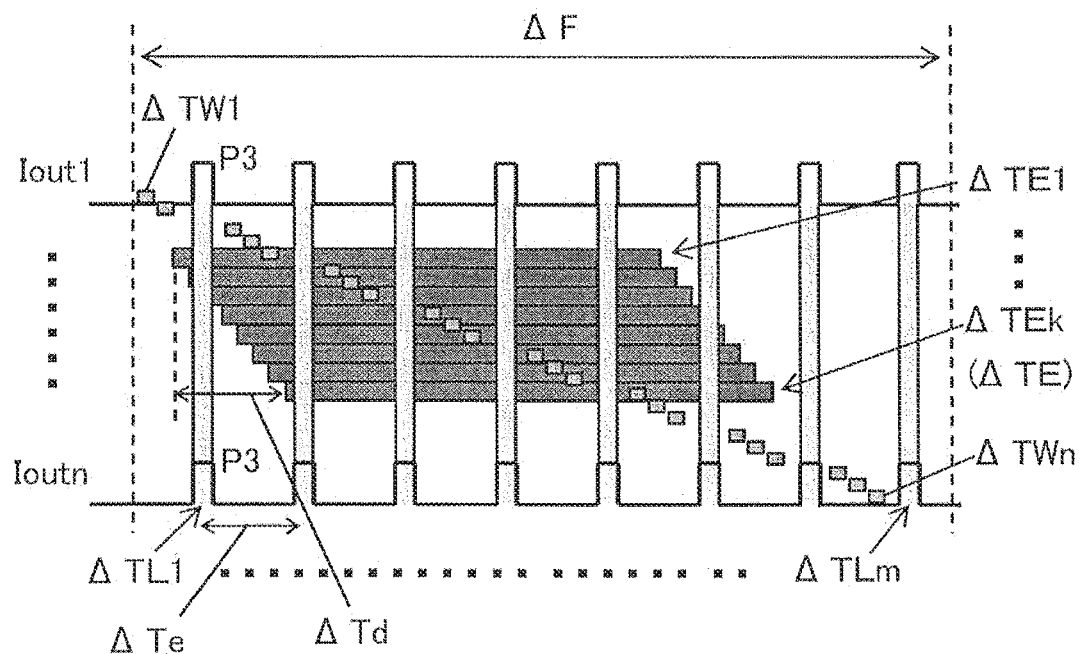
[ FIG. 7 ]
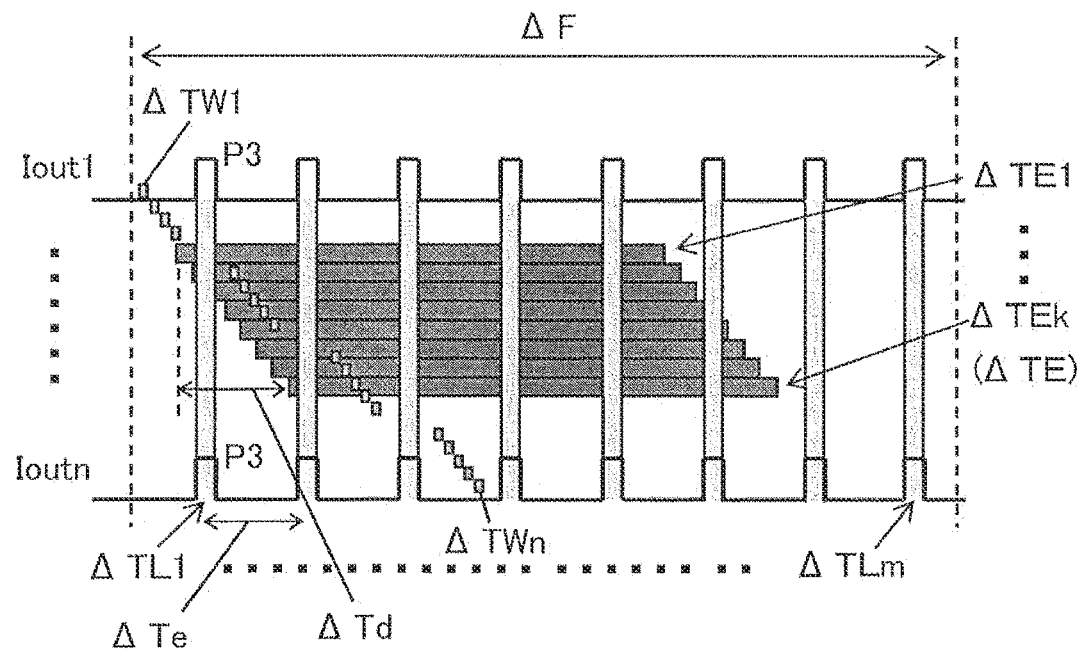

[FIG. 8]
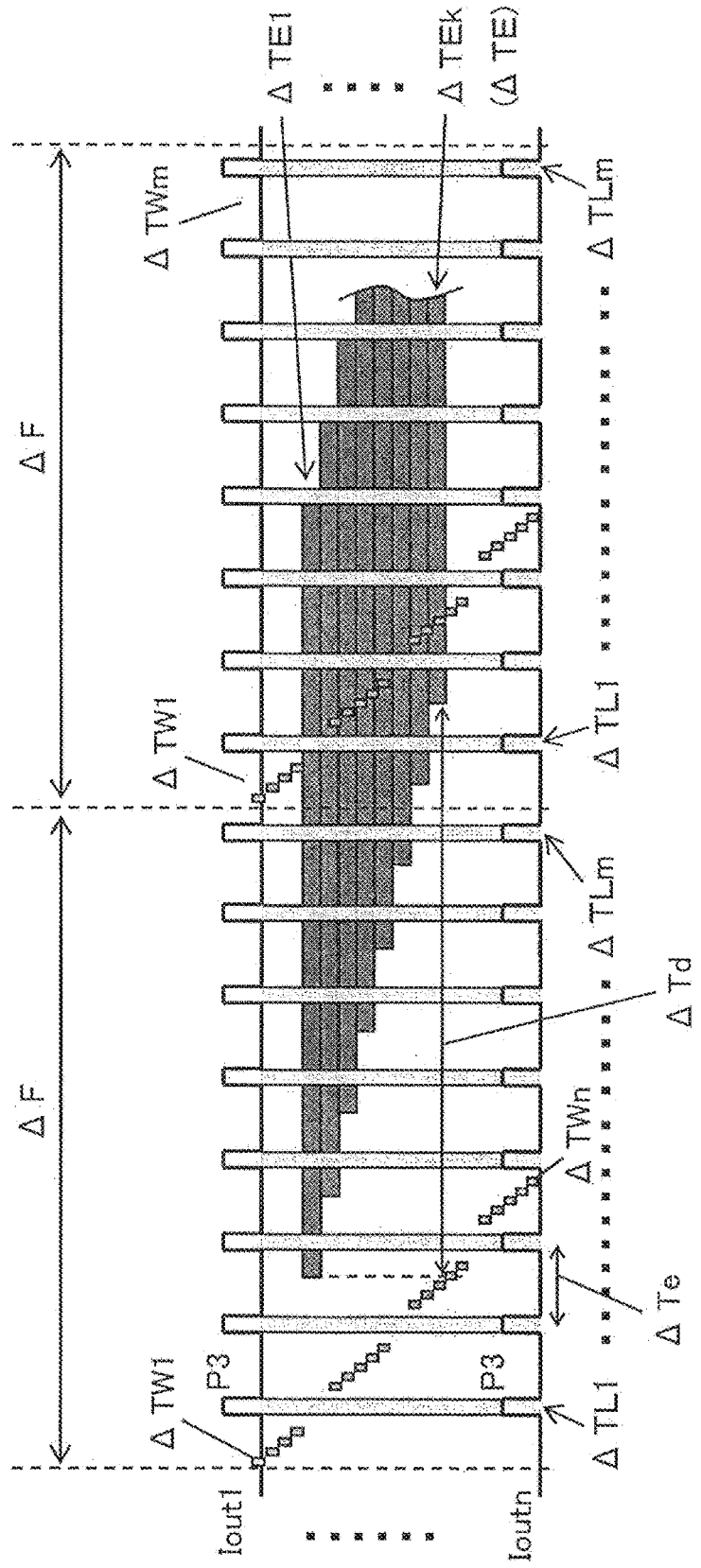

[ FIG. 9 ]
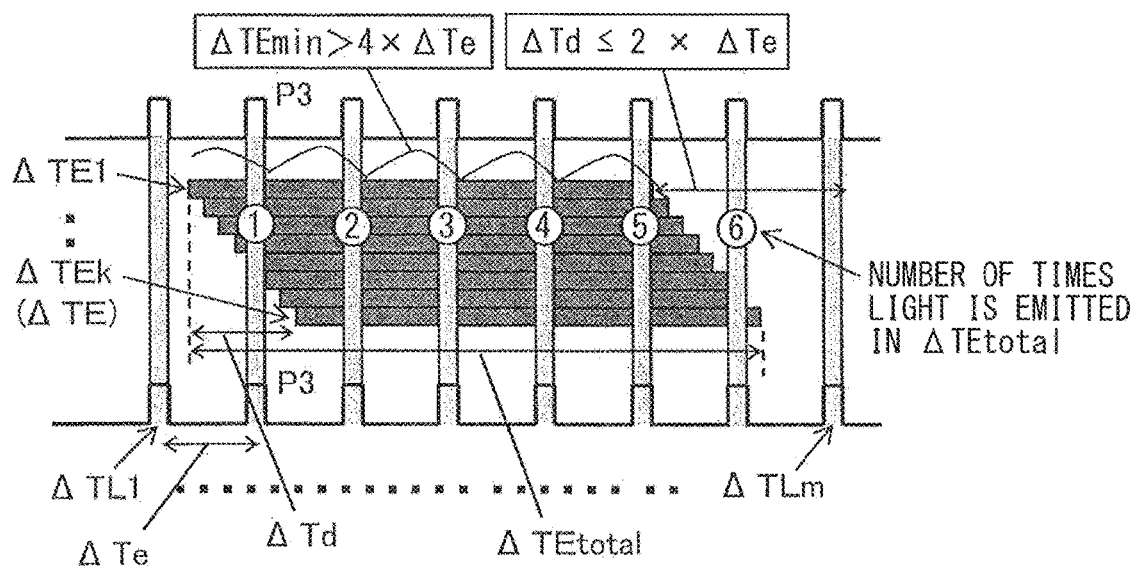
[ FIG. 10 ]
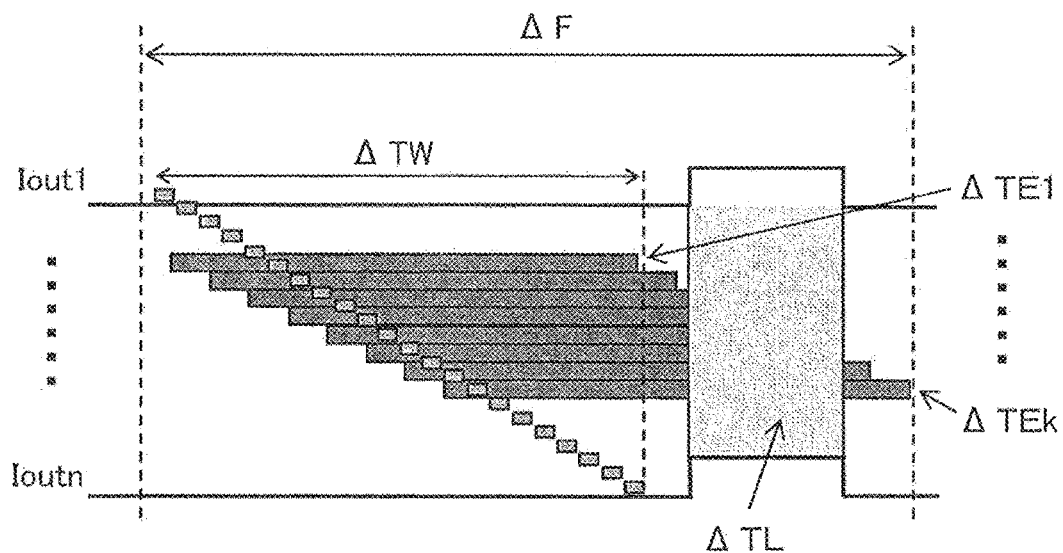

[FIG. 11]
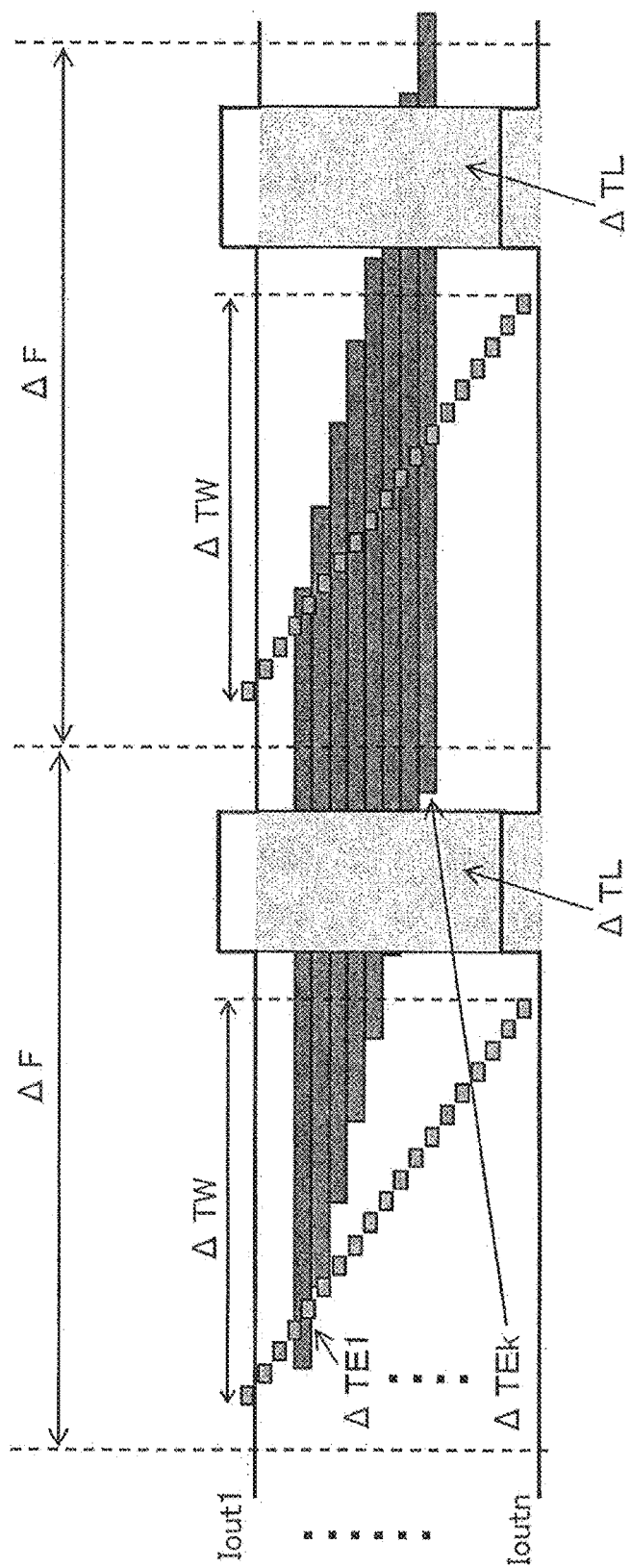

[ FIG. 12 ]
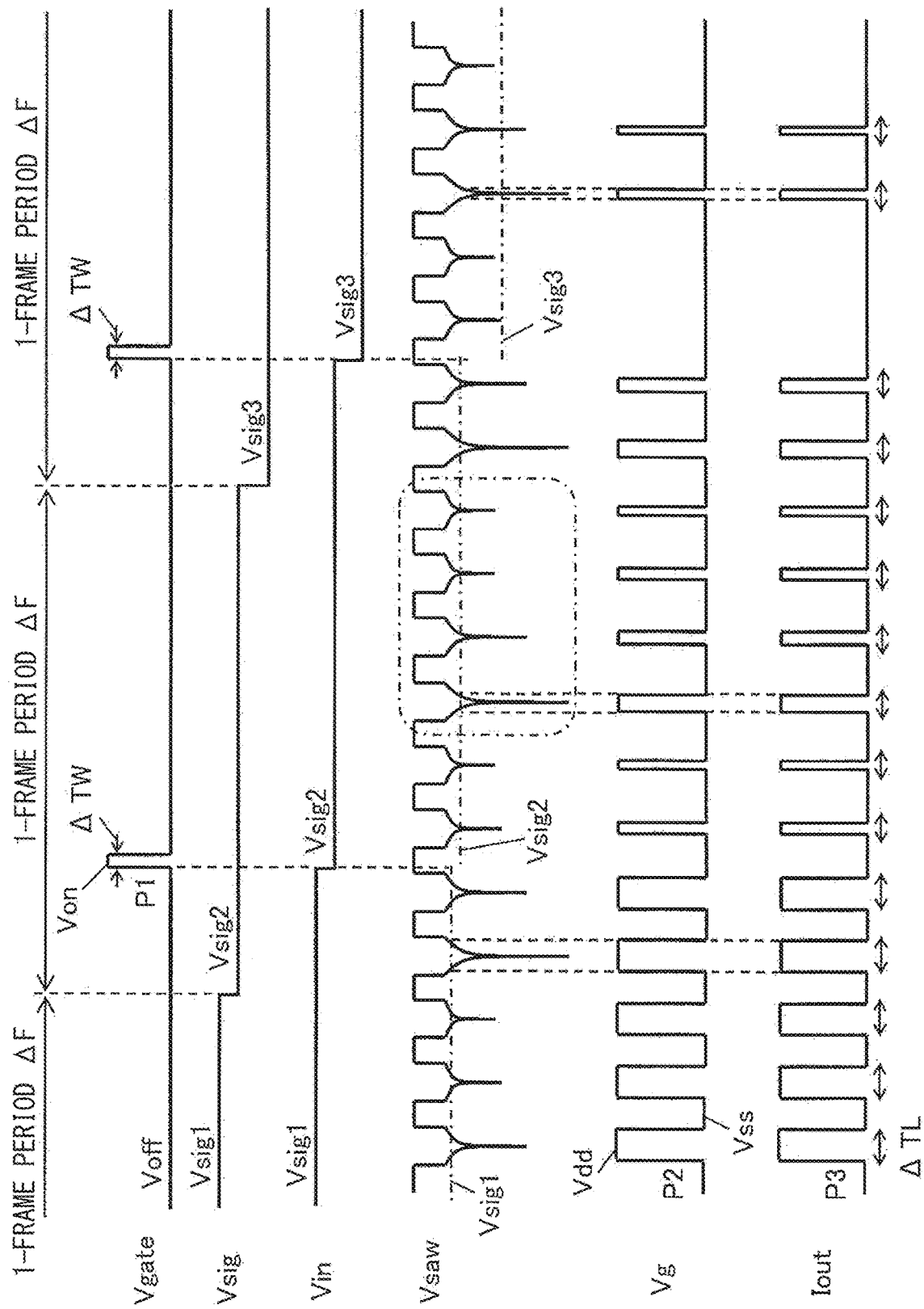

[ FIG. 13 ]
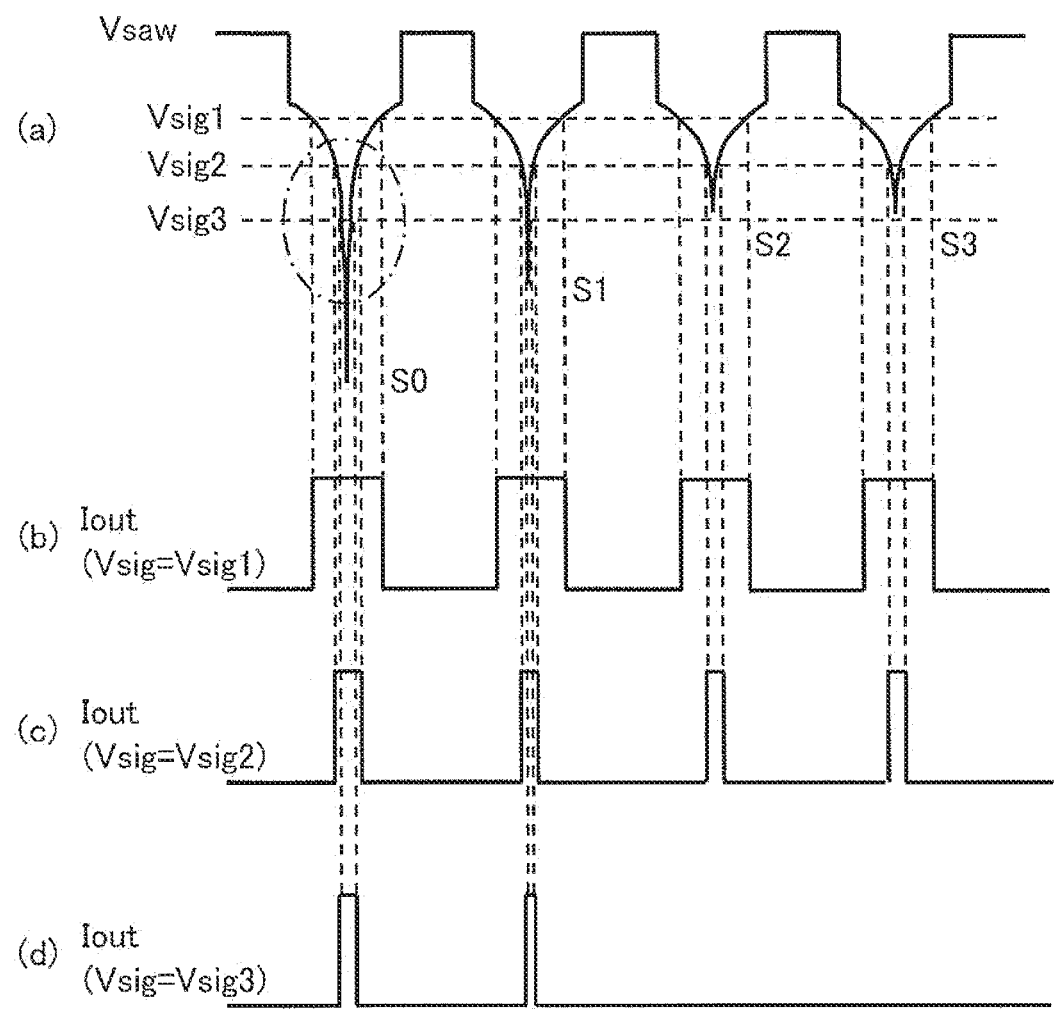

[FIG. 14]
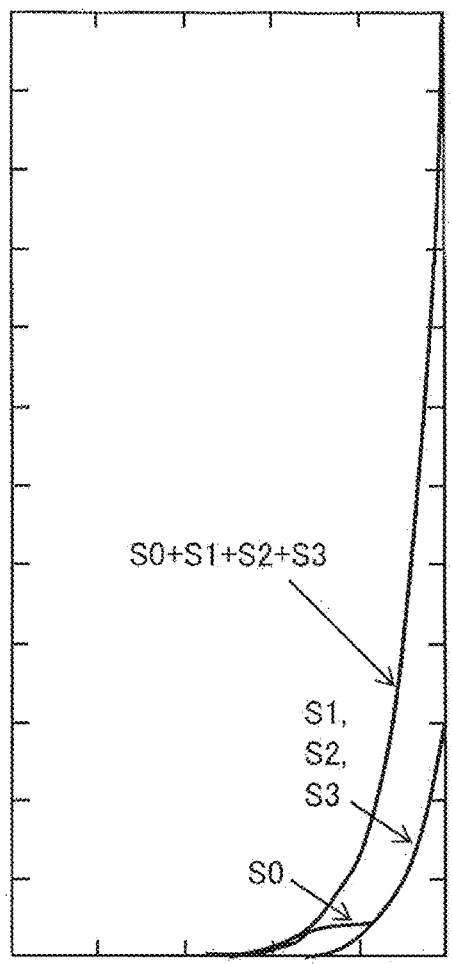
[FIG. 15]
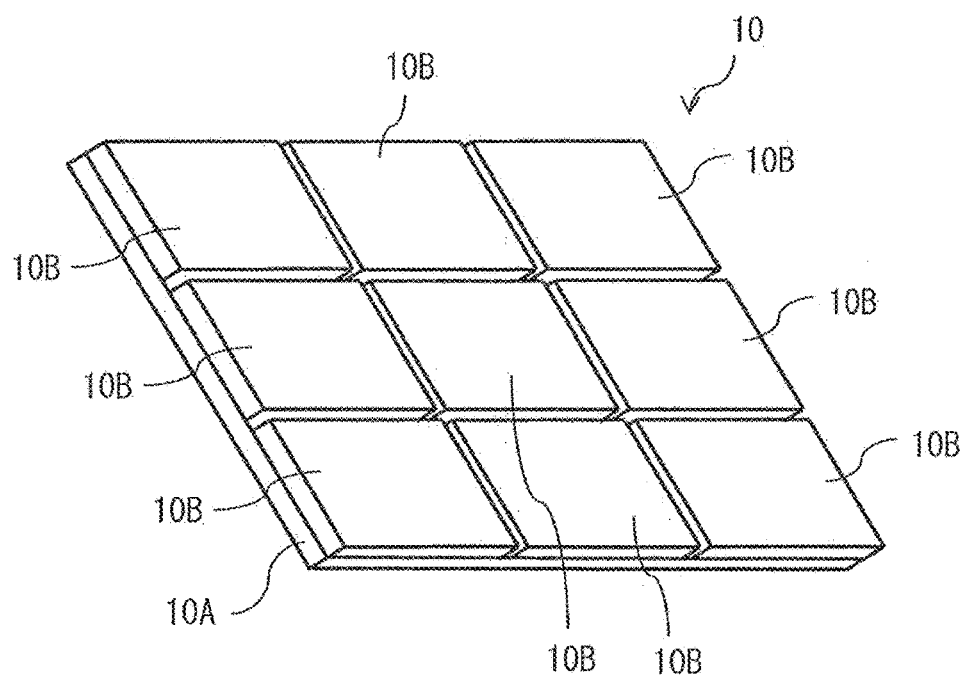

[ FIG. 16 ]
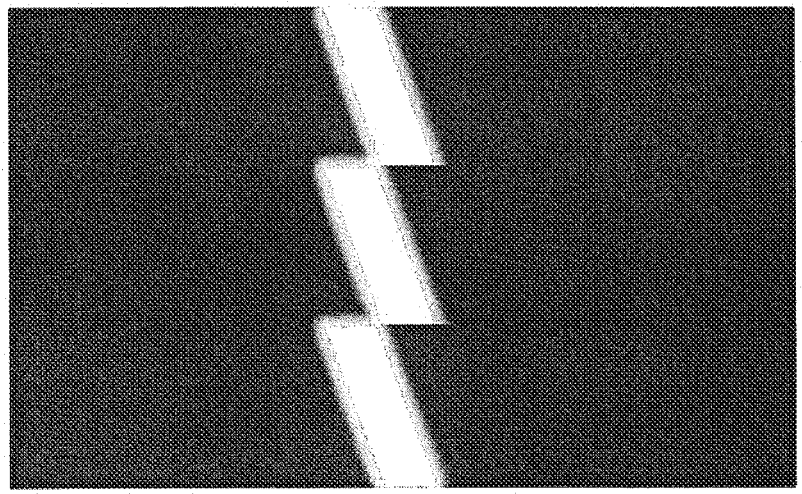

[FIG. 17]
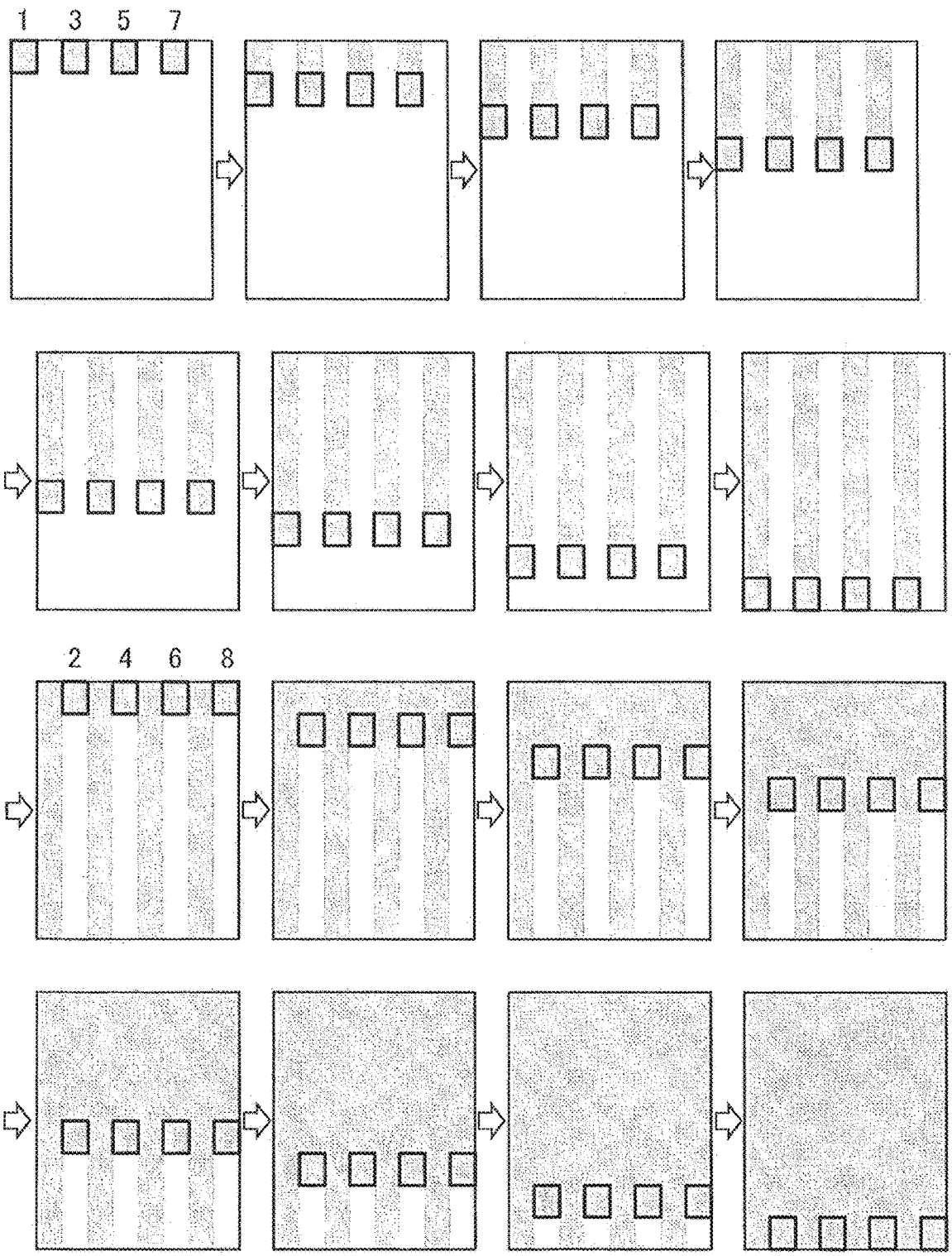

[ FIG. 18 ]
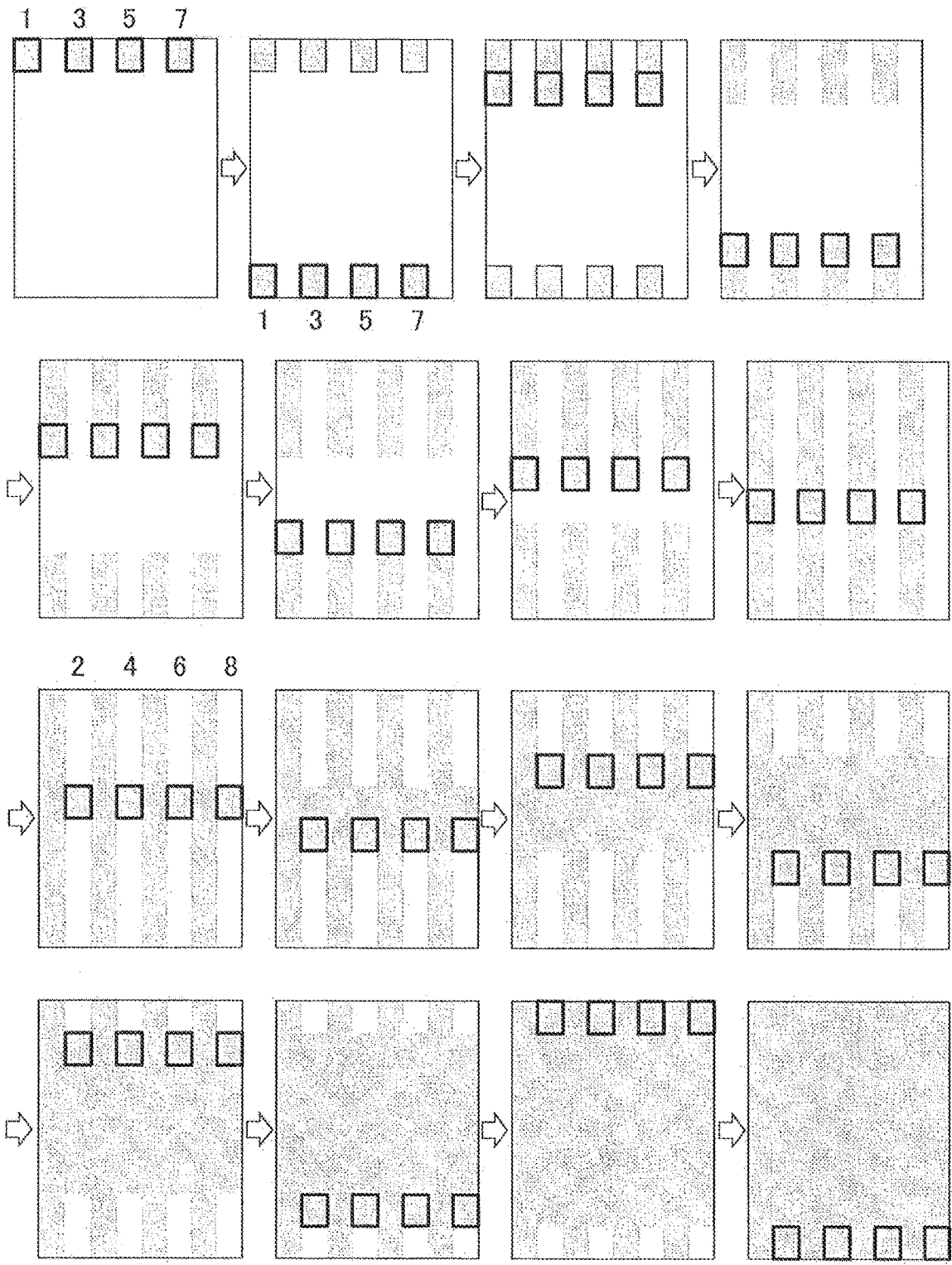

[ FIG. 19 ]
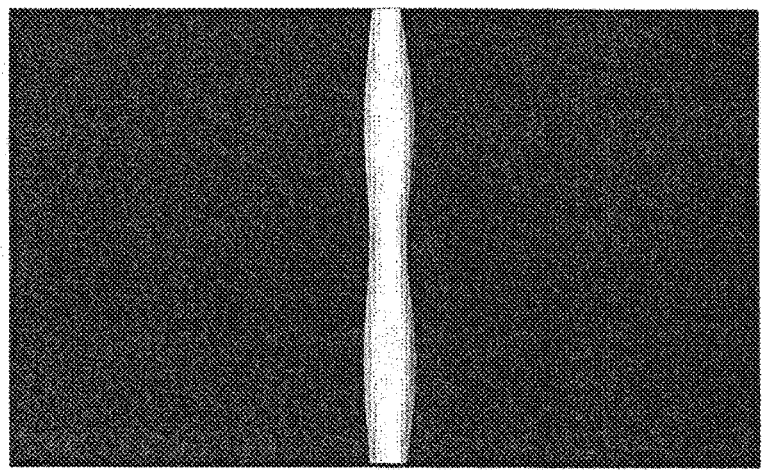
[ FIG. 20 ]
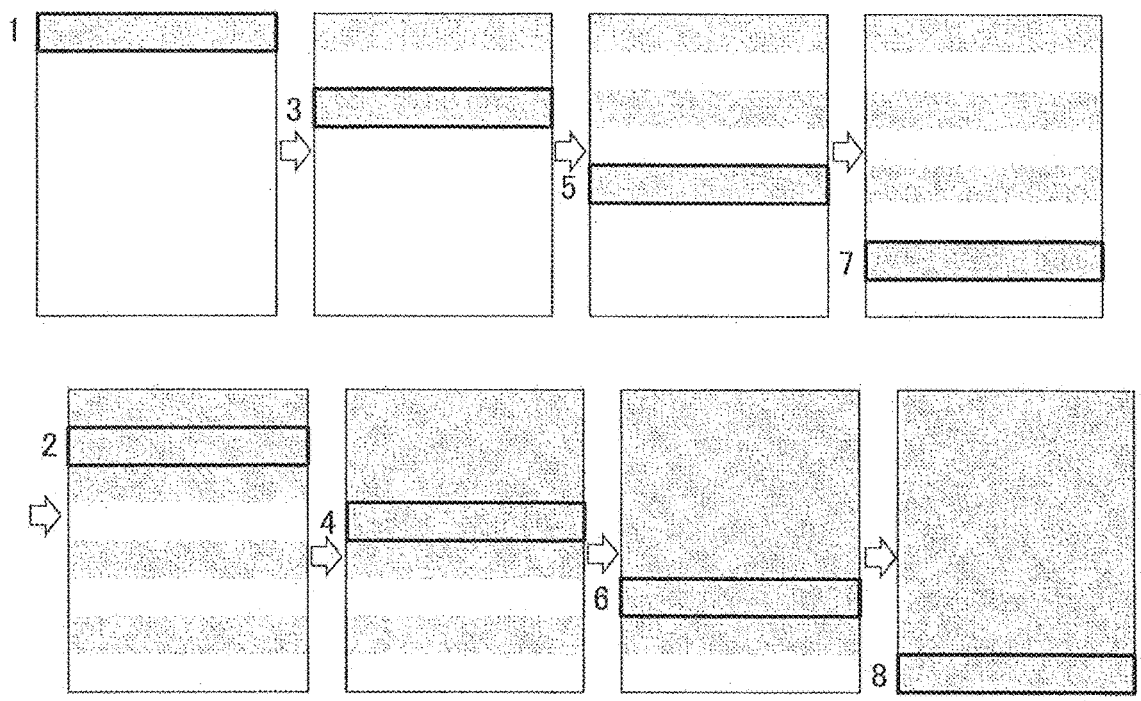

[ FIG. 21 ]
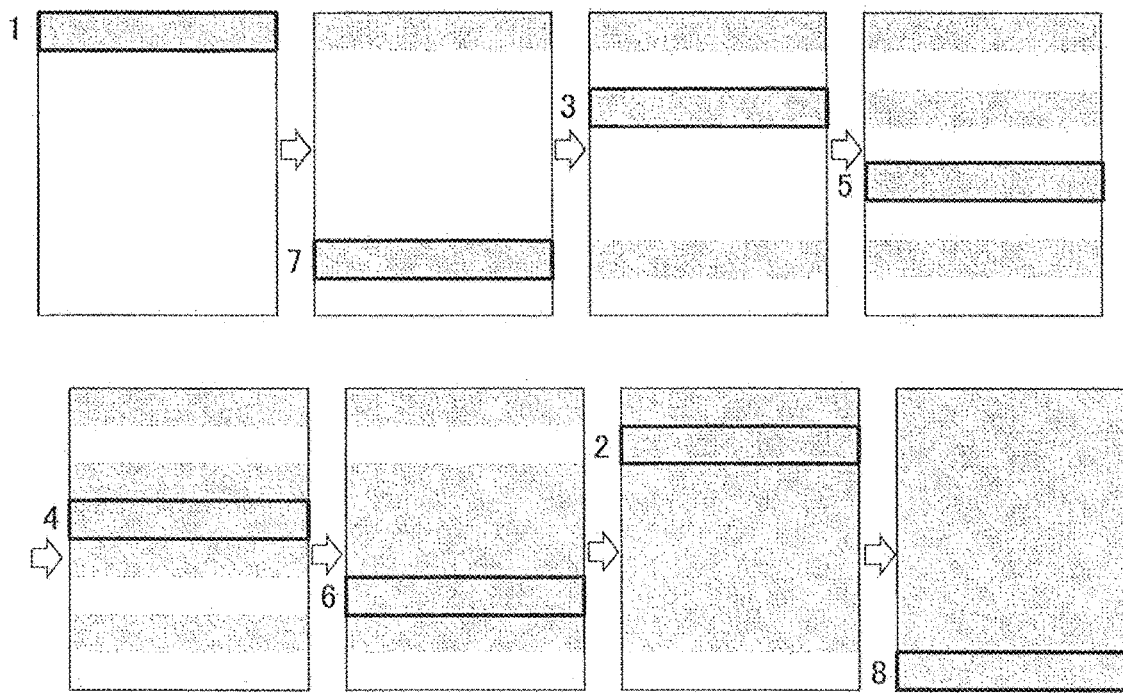
[ FIG. 22A ]
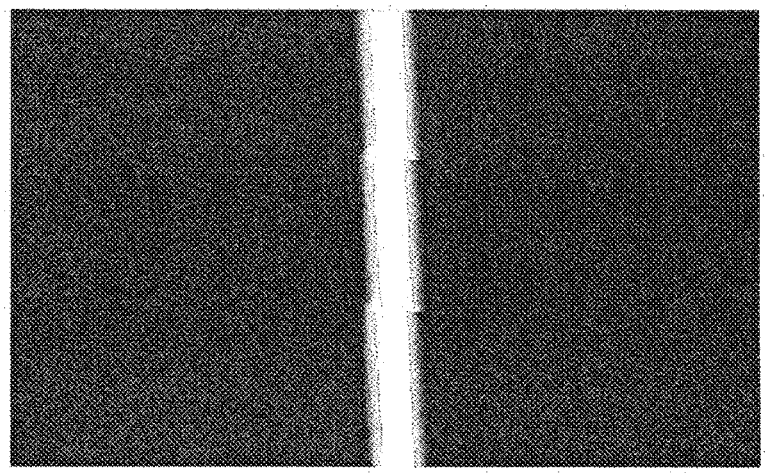

[ FIG. 22B ]
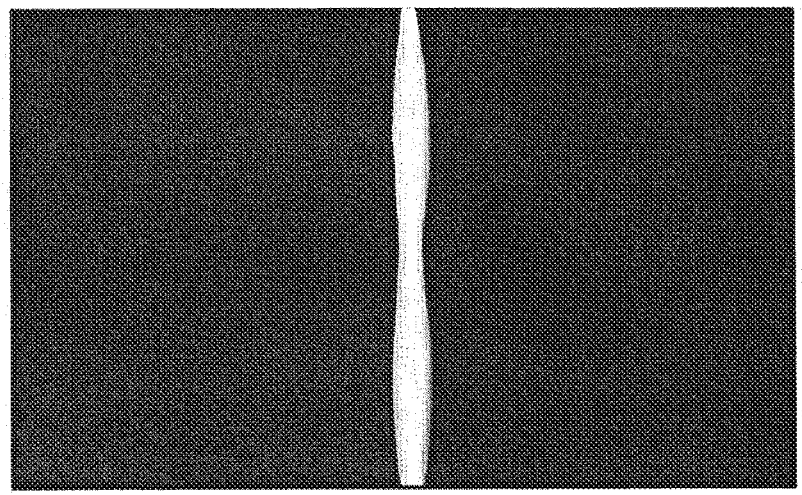
[ FIG. 23 ]
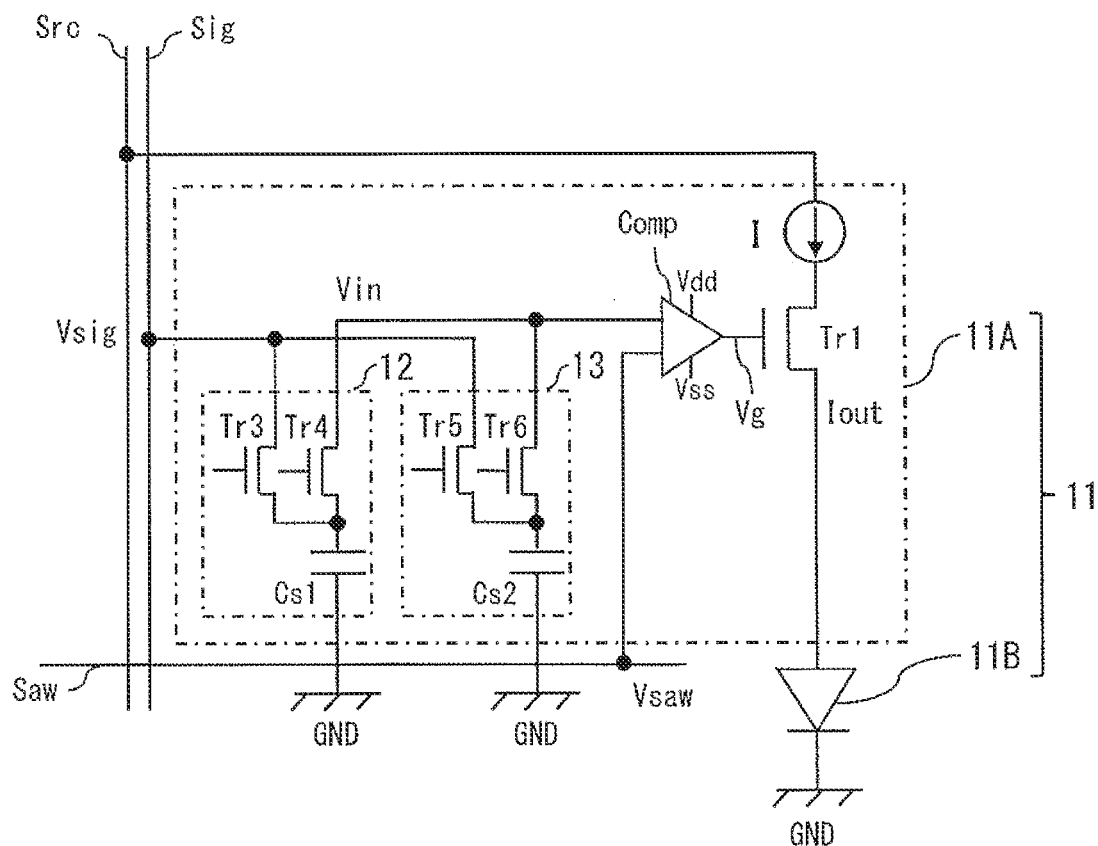

[FIG. 24]
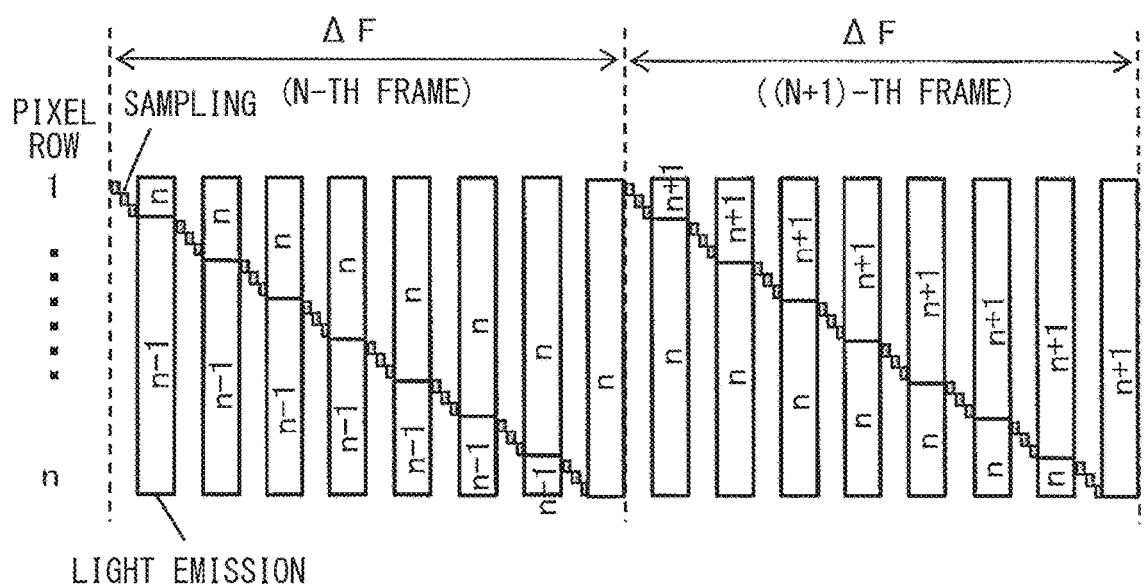

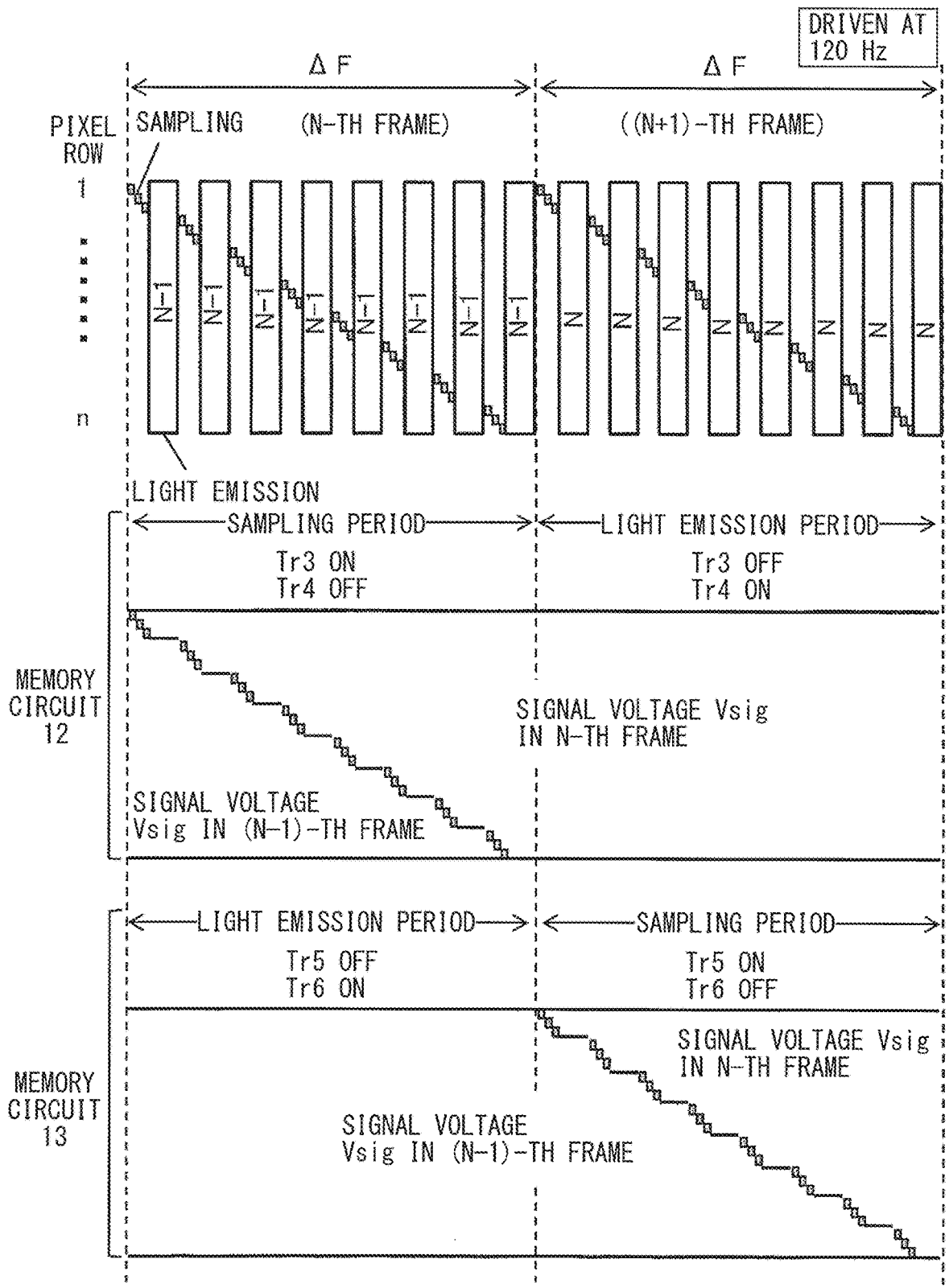

[FIG. 26]
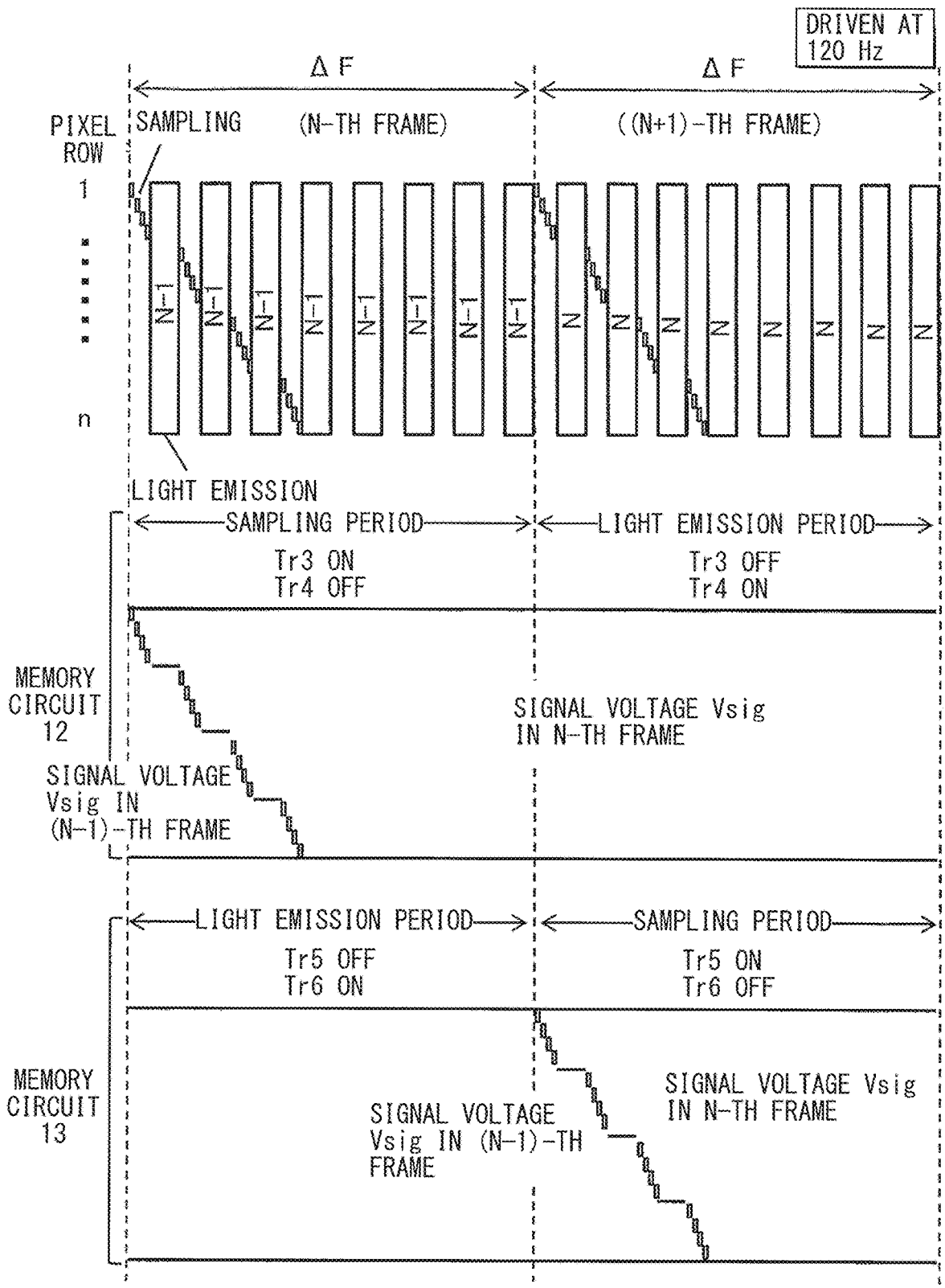

[FIG. 27]
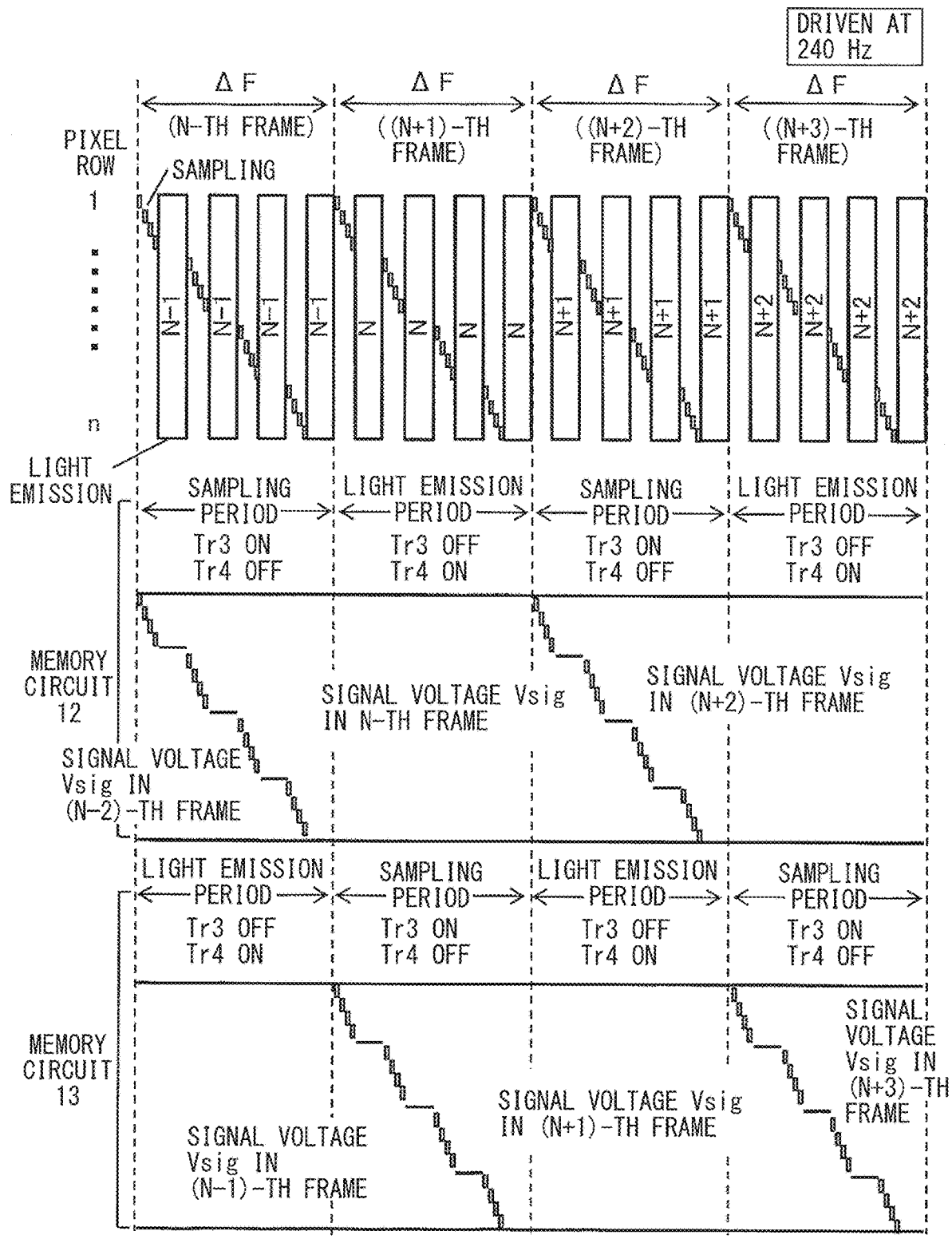

[FIG. 28]
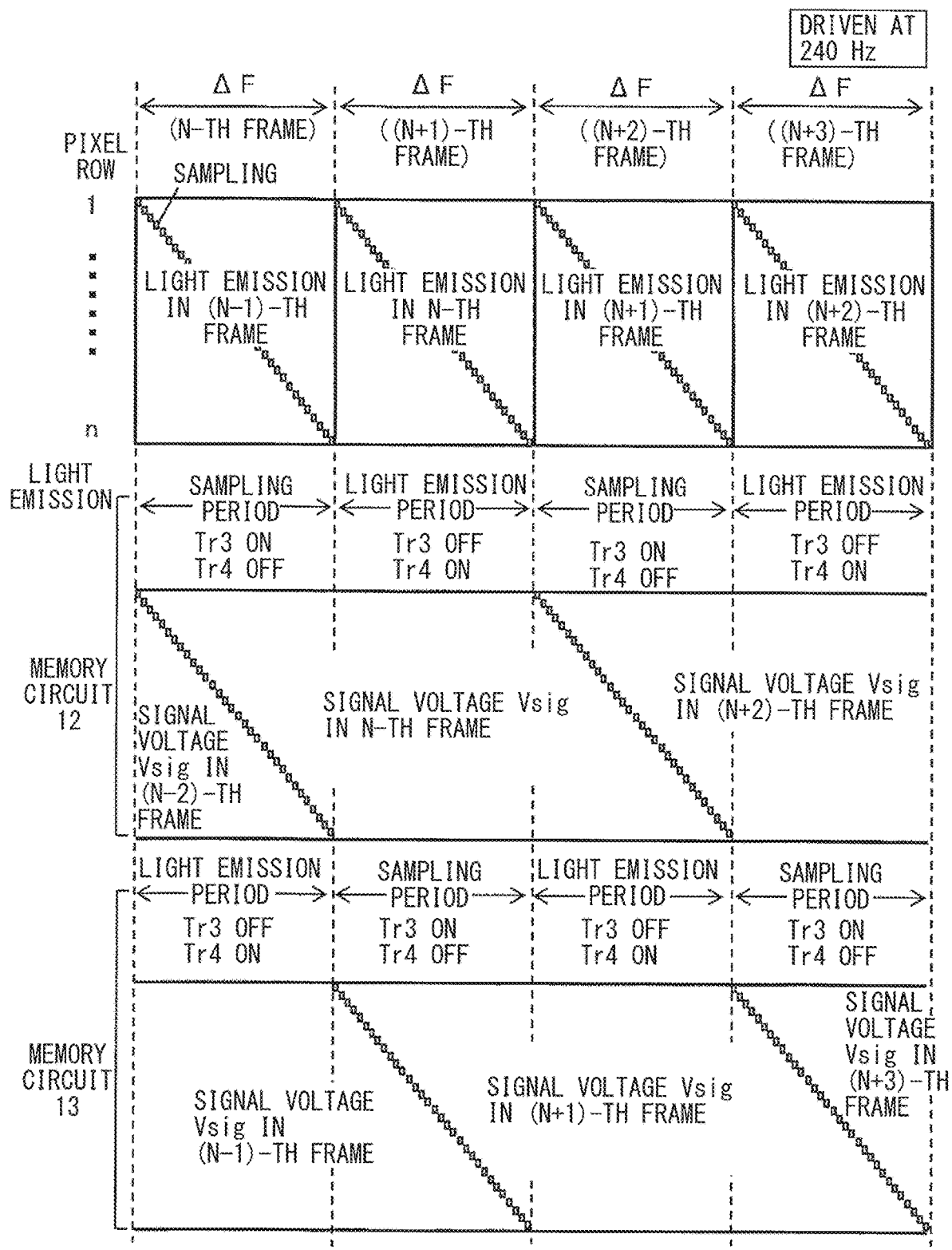

[ FIG. 29 ]
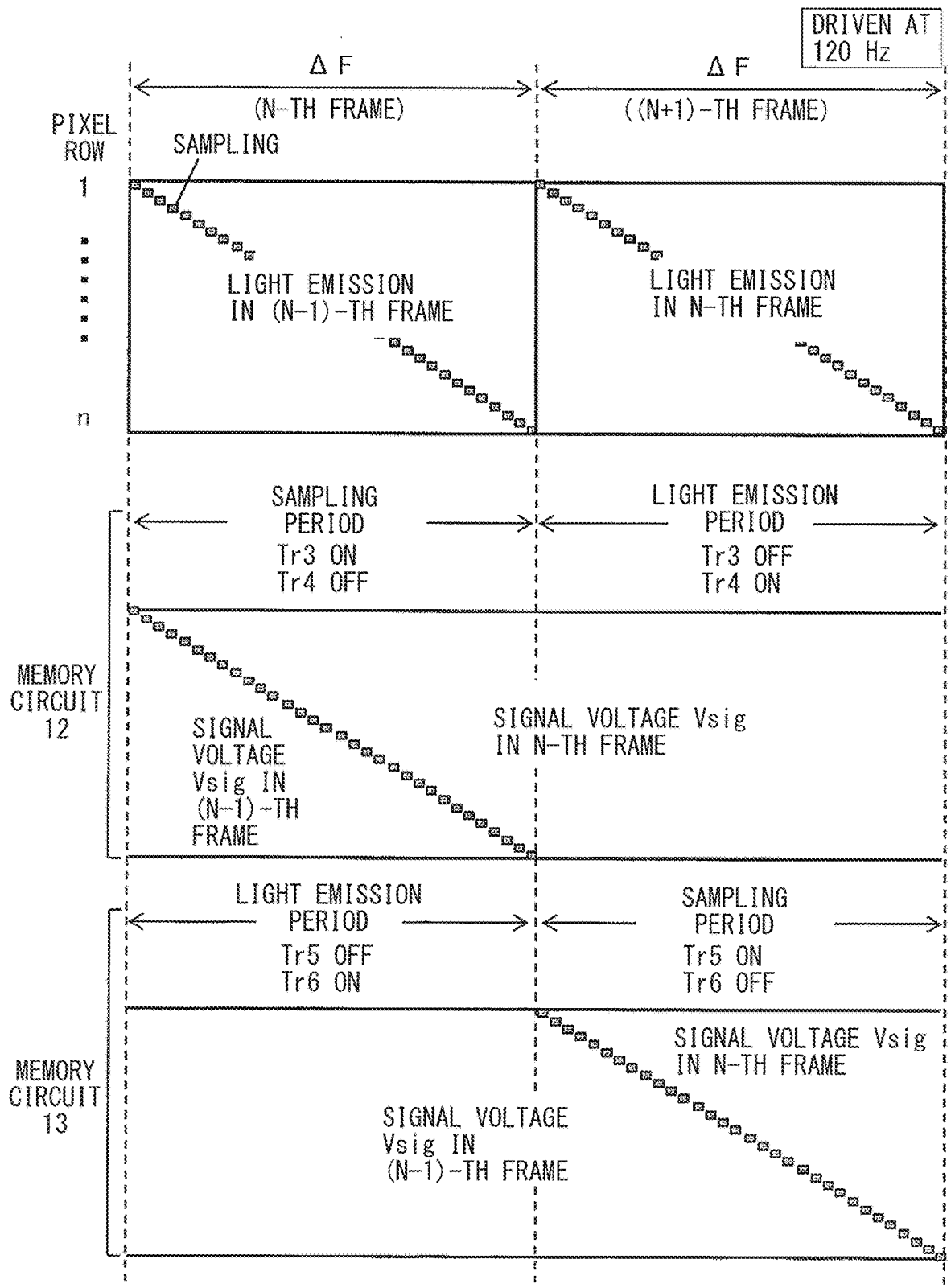

DRIVE DEVICE AND DISPLAY APPARATUS

CROSS-REFERENCE TO RELATED APPLICATIONS

This is a U.S. National Stage Application under 35 U.S.C. § 371, based on International Application No. PCT/JP2018/008524, filed in the Japanese Patent Office as a Receiving Office on Mar. 6, 2018, entitled "DRIVE DEVICE AND DISPLAY DEVICE," which claims priority under 35 U.S.C. § 119(a)-(d) or 35 U.S.C. § 365(b) to Japanese Patent Application Number JP2017-041965, filed in the Japanese Patent Office on Mar. 6, 2017, each of which is hereby incorporated by reference in its entirety.

TECHNICAL FIELD

The present disclosure relates to a drive device and a display apparatus.

BACKGROUND ART

In recent years, LED displays using fine LEDs (Light Emitting Diodes) for display pixels have been attracting attention as light-weighted and thin displays. LED displays have less dependence on the angular field of view, which changes contrast or tones depending on viewing angles, and are characteristically high in speed of response to a color change (see PTL 1).

CITATION LIST

Patent Literature

PTL 1: Japanese Unexamined Patent Application Publication No. 2015-092529

SUMMARY OF THE INVENTION

Incidentally, in a case where an LED display is photographed by a camera, an image resulting from the photography sometimes has band-shaped luminance unevenness. It is thus desirable to provide a drive device that makes it possible to, in a case where photography is performed by a camera, suppress the occurrence of band-shaped luminance unevenness in an image resulting from the photography, and a display apparatus including the drive device.

A drive device according to an embodiment of the present disclosure includes an output unit that outputs a driving signal to a display panel including a plurality of pixels. The driving signal causes one of the pixels to emit light many times by an active PWM drive method in a 1-frame period.

A display apparatus according to an embodiment of the present disclosure includes: a display panel including a plurality of pixels; and a drive device that outputs a driving signal to the display panel. The driving signal causes one of the pixels to emit light many times by an active PWM drive method in a 1-frame period.

The drive device and display apparatus according to an embodiment of the present disclosure output, to the display panel, the driving signals that cause one of the pixels to emit light many times by the active PWM drive method in the 1-frame period. This allows one of the pixels to emit light many times in the 1-frame period in the display panel driven by the active PWM drive method. Accordingly, in a case where the display apparatus is photographed by a camera, it is possible to capture light emission in each pixel in the exposure period.

The drive device and display apparatus according to an embodiment of the present disclosure make it possible to capture light emission in each pixel in the exposure period in a case where the display apparatus is photographed by a camera. Accordingly, it is possible to suppress the occurrence of band-shaped luminance unevenness in an image resulting from the photography performed by the camera. Note that the effects of the present disclosure are not necessarily limited to the effects described here, but may include any of the effects described herein.

BRIEF DESCRIPTION OF DRAWINGS

FIG. 1 is a diagram illustrating a schematic configuration example of a display apparatus according to an embodiment of the present disclosure.

FIG. 2 is a diagram illustrating an example of a circuit configuration of a pixel in FIG. 1.

FIG. 3 is a diagram illustrating an example of a voltage waveform of a signal inputted to each pixel in FIG. 1, and examples of a voltage waveform and current waveform of a signal generated in each pixel in FIG. 1.

FIG. 4 is a diagram illustrating an example of a temporal change in light emission on a display panel in FIG. 1.

FIG. 5 is a diagram illustrating an example of a temporal change in light emission on the display panel in FIG. 1.

FIG. 6 is a diagram illustrating an example of a temporal change in light emission on the display panel in FIG. 1, and an example of a temporal change in camera exposure when a camera has a short exposure period.

FIG. 7 is a diagram illustrating an example of a temporal change in light emission on the display panel in FIG. 1, and an example of a temporal change in camera exposure when a camera has a short exposure period.

FIG. 8 is a diagram illustrating an example of a temporal change in light emission on the display panel in FIG. 1, and an example of a temporal change in camera exposure when a camera has a long exposure period.

FIG. 9 is a diagram illustrating an example of a temporal change in light emission on the display panel in FIG. 1, and an example of a temporal change in camera exposure.

FIG. 10 is a diagram illustrating an example of a temporal change in light emission on a display panel according to a comparative example, and an example of a temporal change in camera exposure when a camera has a short exposure period.

FIG. 11 is a diagram illustrating an example of a temporal change in light emission on the display panel according to the comparative example, and an example of a temporal change in camera exposure when a camera has a long exposure period.

FIG. 12 is a diagram illustrating a modification example of a voltage waveform of a signal inputted to each pixel in FIG. 1, and modification examples of a voltage waveform and current waveform of a signal generated in each pixel in FIG. 1.

FIG. 13 is an enlarged view of a portion of a waveform of a saw signal, and an output current corresponding to magnitude of a signal voltage in FIG. 12.

FIG. 14 is a diagram illustrating an example of a gamma function for the saw signal in FIG. 13 to be inputted to a pixel circuit.

FIG. 15 is a diagram illustrating a modification example of a configuration of the display panel in FIG. 1.

FIG. 16 is a diagram illustrating a state in which an image has a jagged stripe.

FIG. 17 is a diagram illustrating an example of a scanning procedure of a plurality of pixels in the display panel.

FIG. 18 is a diagram illustrating an example of the scanning procedure of the plurality of pixels in the display panel.

FIG. 19 is a diagram illustrating a state of an image with a scanning method in FIG. 18 used.

FIG. 20 is a diagram illustrating an example of the scanning procedure of the plurality of pixels in the display panel.

FIG. 21 is a diagram illustrating an example of the scanning procedure of the plurality of pixels in the display panel.

FIG. 22A is a diagram illustrating a state of an image with a scanning method in FIG. 20 used.

FIG. 22B is a diagram illustrating a state of an image with a scanning method in FIG. 21 used.

FIG. 23 is a diagram illustrating a modification example of a circuit configuration of the pixel in FIG. 1.

FIG. 24 is a diagram illustrating an example of a temporal change in light emission on the display panel including the pixel in FIG. 2.

FIG. 25 is a diagram illustrating an example of a temporal change in light emission on the display panel including the pixel in FIG. 23, and an example of a voltage held in a memory circuit.

FIG. 26 is a diagram illustrating an example of a temporal change in light emission on the display panel including the pixel in FIG. 23, and an example of a voltage held in a memory circuit.

FIG. 27 is a diagram illustrating an example of a temporal change in light emission on the display panel including the pixel in FIG. 23, and an example of a voltage held in a memory circuit.

FIG. 28 is a diagram illustrating an example of a temporal change in light emission on the display panel including the pixel in FIG. 23, and an example of a voltage held in a memory circuit.

FIG. 29 is a diagram illustrating an example of a temporal change in light emission on the display panel including the pixel in FIG. 23, and an example of a voltage held in a memory circuit.

MODES FOR CARRYING OUT THE INVENTION

Hereinafter, an embodiment for practicing the present disclosure will be described in detail with reference to the drawings. The following description is a specific example of the present disclosure, but the present disclosure is not limited to the following embodiment.

<Embodiment>
[Configuration]

FIG. 1 is a perspective view of an example of the schematic configuration of a display apparatus 1 according to an embodiment of the present disclosure. The display apparatus 1 according to the present embodiment is a so-called LED display, and uses LEDs as display pixels. For example, as illustrated in FIG. 1, this display apparatus 1 includes a display panel 10, and a controller 20 and a driver 30 that drive the display panel 10. The driver 30 is implemented, for example, on the outer edge portion of the display panel 10. The driver 30 includes a source driver 31 and a gate driver 32. The controller 20 and the driver 30 drive the display panel 10 on the basis of an image signal Din and a synchronizing signal Tin that are inputted from the outside. The controller 20 and the driver 30 correspond to specific examples of an "output unit" and a "drive device" of the present disclosure.

(Display Panel 10)

The display panel 10 has a plurality of pixels 11 arranged in a matrix on the whole pixel region of the display panel 10. The pixel region corresponds to a region (display region) on the display panel 10 on which an image is displayed. The controller 20 and the driver 30 driving the respective pixels 11 with active PWM (Pulse Width Modulation) causes the display panel 10 to display, on the display region, an image based on the image signal Din and the synchronizing signal Tin inputted from the outside.

FIG. 2 illustrates an example of the circuit configuration of each pixel 11. FIG. 3 illustrates an example of the voltage waveform of a signal inputted to the pixel 11, and examples of the voltage waveform and current waveform of a signal generated in each pixel 11. The display panel 10 includes, for example, a plurality of gate lines Gate and a plurality of saw voltage lines Saw extending in the row direction, and a plurality of data lines Sig and a plurality of power source lines Src extending in the column direction. The pixels 11 are provided in association with the respective intersections of the data lines Sig and the gate lines Gate. Each data line Sig is coupled to the output end of the source driver 31. Each gate line Gate is coupled to the output end of the gate driver 32. Each saw voltage line Saw and each power source line Src are coupled to the output end of the controller 20.

Each data line Sig is a wiring line to which the source driver 31 inputs a signal voltage Vsig having the voltage value corresponding to the image signal Din. The signal voltage Vsig having the voltage value corresponding to the image signal Din is, for example, a signal for controlling the light emission luminance of an LED 11B. The plurality of data lines Sig each includes, for example, a wiring line of the type corresponding to the number of colors of respective pieces of light emitted from the display panel 10. In a case where the display panel 10 emits pieces of light of three respective colors, the plurality of data lines Sig includes, for example, a plurality of data lines Sig (SigR), a plurality of data lines Sig (SigG), and a plurality of data lines Sig (SigB). Each data line Sig (SigR) is a wiring line to which the source driver 31 inputs a signal voltage Vsig having the voltage value corresponding to a red image signal Din. Each data line Sig (SigG) is a wiring line to which the source driver 31 inputs a signal voltage Vsig having the voltage value corresponding to a green image signal Din. Each data line Sig (SigB) is a wiring line to which the source driver 31 inputs a signal voltage Vsig having the voltage value corresponding to a blue image signal Din. The display panel 10 does not necessarily have to emit pieces of light of three respective colors, but may emit pieces of light of four or more respective colors or light of a single color.

Each gate line Gate is a wiring line to which the gate driver 32 inputs a selection pulse P1 for selecting the LED 11B. The selection pulse P1 for selecting the LED 11B is a signal that, for example, causes the sampling of the signal voltage Vsig inputted to the data line Sig to start, and causes the sampled voltage (input voltage Vin) of the signal to be inputted to the positive input terminal of a comparator Comp. The signal voltage Vsig has the voltage value corresponding to the gray-scale of the image signal Din. The plurality of gate lines Gate is allocated one by one, for example, for each pixel row. When the signal voltage Vsig is sampled, the input voltage Vin has the peak value (e.g., Vsig2) of the signal voltage Vsig and keeps the voltage value (e.g., Vsig2) until the next sampling.

Each saw voltage line Saw is a wiring line to which the controller 20 inputs, for example, a signal (saw voltage Vsaw) having a saw-shaped waveform. The saw voltage Vsaw is a signal that is compared with the input voltage Vin. The saw voltage Vsaw is a signal for generating an output current pulse P3 that is inputted to the LED 11B, for example, only while the peak value of the saw voltage Vsaw is lower than the peak value of the input voltage Vin. One saw voltage line Saw is allocated, for example, for each pixel row. The saw voltage Vsaw has, for example, the same number of saw signals S in a 1-frame period ΔF as the number of times light is emitted in the 1-frame period ΔF. Each saw signal S includes a saw pulse that falls as a curve expressed with an upward-convex exponential function, and rises as a curve expressed with an upward-convex exponential function. In each saw signal S, the saw pulse has a pulse shape that protrudes on the negative side of voltage. In each saw signal S, the lower limit value of the saw pulse is a value greater than the lower limit value of the signal voltage Vsig, and less than the upper limit value of the signal voltage Vsig.

Each power source line Src is a wiring line to which the controller 20 inputs a drive current that is supplied to the LED 11B. One power source line Src is allocated, for example, for each pixel column. Each power source line Src and each ground line GND are wiring lines to each of which the controller 20 inputs a fixed voltage. Each ground line GND receives a ground potential.

Each pixel 11 includes a pixel circuit 11A, and the LED 11B. The pixel circuit 11A controls the light emission and light extinction of the LED 11B. The pixel circuit 11A has a function of holding a voltage (input voltage Vin) written into each pixel 11 by signal writing described below. The pixel circuit 11A further has a function of outputting the output current pulse P3 to the LED 11B. The output current pulse P3 has the width corresponding to the magnitude of the held voltage. The pixel circuit 11A includes, for example, a driving transistor Tr1, a write transistor Tr2, a storage capacitor Cs, the comparator Comp, and a current source I.

The write transistor Tr2 controls the application of the signal voltage Vsig to the positive input terminal of the comparator Comp. Specifically, the write transistor Tr2 samples the voltage (signal voltage Vsig) of the data line Sig, and writes the sampled voltage (input voltage Vin) into the positive input terminal of the comparator Comp. The storage capacitor Cs holds the voltage (input voltage Vin) of the positive input terminal of the comparator Comp. The storage capacitor Cs has a function of holding the voltage (input voltage Vin) of the positive input terminal of the comparator Comp in a constant level in a predetermined period.

The comparator Comp performs control the on and off states of the driving transistor Tr1. In other words, the comparator Comp controls the light emission and light extinction of the LED 11B. When the difference (=Vin−Vsaw) between a voltage (input voltage Vin) applied to the positive input terminal and a voltage (saw voltage Vsaw) applied to the negative input terminal has a positive value, the comparator Comp outputs a voltage Vdd applied to the positive-side power source terminal to the output terminal. In outputting the voltage Vdd to the output terminal, the comparator Comp outputs a pulse (output voltage pulse P2) whose peak value is the voltage Vdd to the output terminal. When the difference (=Vin−Vsaw) has a negative value, the comparator Comp further outputs a voltage Vss applied to the negative-side power source terminal to the output terminal. In other words, the comparator Comp outputs a voltage (output voltage Vg) including the voltages of two values (Vdd and Vss) to the gate of the driving transistor Tr1. The voltage Vdd has a greater value than the value of the threshold voltage of the driving transistor Tr1. The voltage Vss has a smaller value than the value of the threshold voltage of the driving transistor Tr1. Note that the pixel circuit 11A may have a circuit configuration in which a variety of capacitors and transistors are added to the circuit described above, or may have a circuit configuration different from the circuit configuration described above.

The driving transistor Tr1 is coupled to the current source I and the LED 11B in series. The driving transistor Tr1 drives the LED 11B. The driving transistor Tr1 controls a current flowing through the LED 11B in response to an output (output voltage Vg) of the comparator Comp. Once the voltage Vdd is inputted to the gate as the output voltage Vg, the driving transistor Tr1 is turned on and outputs the current from the current source I to the LED 11B. In outputting the current from the current source I to the LED 11B, the driving transistor Tr1 outputs, to the LED 11B, a pulse (output current pulse P3) whose peak value is a predetermined current value determined by the current source I. The following refers to a period in which the driving transistor Tr1 is outputting the output current pulse P3 as light emission period ΔTL. Once the voltage Vss is inputted to the gate as the output voltage Vg, the driving transistor Tr1 is turned off and stops outputting a current to the LED 11B.

The gate of the write transistor Tr2 is coupled to the gate line Gate. The source or drain of the write transistor Tr2 is coupled to the data line Sig. The terminal of the source or drain, uncoupled to the data line Sig, of the write transistor Tr2 is coupled to the positive input terminal of the comparator Comp and one end of the storage capacitor Cs. The other end of the storage capacitor Cs is coupled to the ground line GND. The negative input terminal of the comparator Comp is coupled to the saw voltage line Saw. The output terminal of the comparator Comp is coupled to the gate of the driving transistor Tr1. The source or drain of the driving transistor Tr1 is coupled to the power source line Src via the current source I. The terminal of the source or drain, uncoupled to the power source line Src, of the driving transistor Tr1 is coupled to one end of the LED 11B. The other end of the LED 11B is coupled to the ground line GND.

(Driver 30)

The driver 30 will now be described.

FIGS. 4 and 5 illustrate examples of signal writing and temporal changes in light emission on the display panel 10. FIG. 4 exemplifies a state in which signal writing is performed on the display panel 10 over the 1-frame period ΔF. FIG. 5 exemplifies a state in which signal writing is finished on the display panel 10 in a portion (first half) of the 1-frame period ΔF.

In FIGS. 4 and 5, Iout1 to Ioutn indicate output currents Iout generated in n respective pixel rows. The period of the output current pulse P3 in each of the output currents Iout1 to Ioutn corresponds to the light emission period ΔTL of the LED 11B. In FIGS. 4 and 5, m at the end of the light emission period ΔTL indicates that the number of times light is emitted in the 1-frame period ΔF is m. In FIGS. 4 and 5, n at the end of a write period ΔTW indicates that the number of times writing is performed in the 1-frame period ΔF is n. In FIGS. 4 and 5, ΔTe indicates the light emission cycle of the display panel 10. The light emission cycle ΔTe corresponds to a cycle in which the plurality of saw signals S occurs in the saw voltage Vsaw. FIG. 4 illustrates a state in which the write periods ΔTW for a plurality of pixel rows and the light emission periods ΔTL of all the pixel rows are alternately arranged in the display panel 10 in terms of time. In contrast, FIG. 5 illustrates a state in which the write periods ΔTW for a plurality of pixel rows and the light emission periods ΔTL of all the pixel rows are alternately arranged in the display panel 10 in terms of time in a portion (first half) of a 1-frame period, and the plurality of light emission periods ΔTL of all the pixel rows is periodically arranged in the second half of the 1-frame period.

The driver 30 includes the source driver 31 and the gate driver 32, as described above. Note that signals (signal voltage Vsig, gate voltage Vgate, and saw voltage Vsaw) outputted by the driver 30 to the display panel 10 correspond to specific examples of "driving signals" of the present disclosure.

The source driver 31 applies, to the respective pixels 11 in a pixel row selected by the gate driver 32, the signal voltages Vsig corresponding to the respective selected pixels 11 via the respective data lines Sig. The source driver 31 operates on the basis of an image control signal and a synchronization control signal (described below) supplied from the controller 20, and outputs the signal voltages Vsig to the display panel 10 line by line in parallel via the respective data lines Sig. Whenever each pixel row is selected by the gate driver 32 (i.e., in each write period ΔTW described below), the source driver 31 applies, to each pixel 11 in the selected pixel row, the signal voltage Vsig corresponding to each of the selected pixels 11.

The gate driver 32 sequentially selects the respective pixels 11 in the units of rows. Specifically, the gate driver 32 operates on the basis of a synchronization control signal (described below) supplied from the controller 20, and outputs the gate voltage Vgate to the display panel 10 via each gate line Gate. The gate voltage Vgate causes the respective pixels 11 to be scanned in a predetermined order (e.g., line-sequentially). The gate driver 32 applies, for example, to the plurality of gate lines Gate, the respective selection pulses P1 whose peak values are Von. The selection pulse P1 is a pulse for selecting the pixel 11 into which the signal voltage Vsig is written. The selection pulse P1 is a pulse whose peak value is Von. The peak values of the other pulses of the gate voltage Vgate than the selection pulse P1 are Voff. The following refers to the period in which the gate driver 32 is outputting the gate voltage Vgate as write period ΔTW.

The gate driver 32 outputs each selection pulse P1 to the display panel 10 while avoiding the light emission period ΔTL. For example, the gate driver 32 outputs the plurality of selection pulses P1 for the plurality of pixel rows to the display panel 10 in the period before the light emission period ΔTL, and then continues outputting the plurality of selection pulses P1 for the plurality of subsequent pixel rows to the display panel 10 after the light emission period ΔTL starts and ends. In this way, in the present embodiment, the write period ΔTW and the light emission period ΔTL do not coincide with each other in any period. Note that, in FIG. 5, the gate driver 32 completes, in a portion (first half) of the 1-frame period ΔF, outputting the selection pulses P1 by the gate driver 32.

(Controller 20)

The controller 20 will now be described. The controller 20 generates an image control signal, for example, on the basis of the digital image signal Din inputted from the outside. The controller 20 outputs, to the source driver 31, the image control signal generated, for example, on the basis of the image signal Din. The controller 20 outputs synchronization control signals to the source driver 31 and the gate driver 32, for example, in response to (in synchronization with) the synchronization signal Tin inputted from the outside.

The controller 20 further applies the saw voltages Vsaw, for example, to the respective pixels 11 via the respective saw voltage lines Saw. The controller 20 applies, for example, a predetermined number of saw signals S to the respective pixels 11 in the 1-frame period ΔF. The controller 20 applies, for example, the plurality of saw signals S to the respective pixels 11 at substantially equal temporal intervals. The controller 20 applies, for example, the respective saw signals S to the respective pixels 11 at once (concurrently).

FIGS. 6 and 7 each illustrate an example of a temporal change in light emission on the display panel 10, and an example of a temporal change in camera exposure when a camera has a short exposure period. FIG. 6 exemplifies a state in which signal writing is performed on the display panel 10 over the 1-frame period ΔF. FIG. 7 exemplifies a state in which signal writing is finished on the display panel 10 in a portion (first half) of the 1-frame period ΔF. FIG. 8 illustrates an example of a temporal change in light emission on the display panel 10, and an example of a temporal change in camera exposure when a camera has a long exposure period. FIGS. 6 to 8 each illustrate examples of light emission timing of the display panel 10 and exposure timing of a camera at which, while an image is displayed on the display panel 10, the displayed image is photographed by the camera.

In FIGS. 6 to 8, a camera adopts a rolling shutter for exposure. The rolling shutter indicates a method in which exposure starts for each pixel row in order from the top in a sensor element of a camera. The rolling shutter is a method that is generally used for CMOS (Complementary Metal Oxide Semiconductor) sensors. In FIGS. 6 to 8, ΔTE1 to ΔTEk indicate exposure periods of k respective pixel rows in a CMOS sensor. It is indicated by k at the end of the exposure period ΔTEk that the number of pixel rows in a CMOS sensor is k. In FIGS. 6 to 8, ΔTE is a collective term of ΔTE1 to ΔTEk. In FIGS. 6 to 8, ΔTd is a period from a start of exposure of the first line to a start of exposure of the last line in the CMOS sensor.

For example, as illustrated in FIG. 3 and FIGS. 6 to 8, the controller 20 and the driver 30 output driving signals to the display panel 10. The driving signals cause one of the pixels 11 to emit light many times (plurality of times) by an active PWM drive method in the 1-frame period ΔF. For example, as illustrated in FIG. 3 and FIGS. 6 to 8, the controller 20 and the driver 30 output, as the driving signals, signals that cause signal writing (write periods ΔTW for a plurality of pixel rows) and light emission (light emission periods ΔTL) in all the pixel rows to be alternately performed. The signal writing corresponds to the image signals Din for a plurality of pixel rows. For example, as illustrated in FIG. 3 and FIGS. 6 to 8, the controller 20 and the driver 30 output, as the driving signals, signals that cause light to be emitted at substantially equal intervals.

For example, as illustrated in FIGS. 6 to 8, the controller 20 and the driver 30 output, as the driving signals, signals satisfying the following Expressions (1) and (2).

$$\Delta TEmin > 4 \times \Delta Te \quad \text{Expression (1)}$$

$$\Delta Td \leq 2 \times \Delta Te \quad \text{Expression (2)}$$

where ΔTEmin denotes the minimum exposure period of a CMOS sensor, ΔTe denotes a light emission cycle, and ΔTd denotes a period from a start of exposure of the first line to a start of exposure of the last line in the CMOS sensor.

For example, as illustrated in FIGS. 6 to 8, the controller 20 and the driver 30 may output, as the driving signals, signals satisfying the following Expression (3).

$$(\Delta Td/k) \times (k/100) = \Delta Td/100 \leq \Delta Te \quad \text{Expression (3)}$$

It is assumed that the minimum exposure time ΔTEmin of the CMOS sensor is four times or more as long as the light emission cycle ΔTe of the display panel 10, and the exposure slide period ΔTd is twice or less as long as the light emission period ΔTe. In this case (i.e., case where light is emitted six times or more in the period (ΔTEtotal) from a start of exposure of the first line to an end of exposure of the last line as illustrated in FIG. 9), the light emission periods ΔTL included in the exposure periods of the respective lines are different in number by at most about one even at the highest shutter speed owing to the time when the shutter of a camera is released. Here, in a case where the minimum exposure time ΔTEmin is about five times as long as the light emission cycle ΔTe and the exposure slide period ΔTd is substantially as long as the light emission cycle ΔTe, a change in the amount of exposure is less than or equal to light emission performed once: 20% or less. This approximately corresponds to the standards of general displays for unevenness, and such a difference does not considerably degrade photographs.

In addition, the value obtained by diving the exposure slide period ΔTd by the number of read lines (number of pixel rows: k) in the CMOS sensor approximately corresponds to a line delay in a camera of the rolling shutter type. The line delay approximately corresponds to a read time per line. In a case where the value obtained by multiplying the line delay by k/100 is ΔTe or less, an image has a stripe pattern once or less every 100 lines. In a case where a stripe pattern appears as frequently as described above, viewing an image in the effective field of view offers a vertical angle of about 10 degrees. The number of stripe patterns per angle is thus 10. This stripe pattern is then hardly recognizable with the sensitivity of eyes. Accordingly, photographs are not considerably degraded.

Effects

The effects of the display apparatus 1 according to the present embodiment will now be described in comparison with a comparative example.

FIG. 10 illustrates an example of a temporal change in light emission on a display panel according to the comparative example, and an example of a temporal change in camera exposure when a camera has a short exposure period. FIG. 11 illustrates, in the comparative example, an example of a temporal change in light emission on the display panel 10, and an example of a temporal change in camera exposure when a camera has a long exposure period. The display panel according to the comparative example has one write period ΔTW and one light emission period ΔTL in the 1-frame period ΔF. When the display panel according to the comparative example is then photographed by a camera of the rolling shutter type, it is sometimes not possible to capture light emission in the exposure period (e.g., exposure period ΔTE1 in FIG. 10) of a portion of the lines. A captured image then has a black streak at the position corresponding to a line in which light emission is not captured. If the display panel according to the comparative example has one write period ΔTW and one light emission period ΔTL in the 1-frame period ΔF, it is sometimes not possible to capture light emission (i.e., light emission performed twice) for a 2-frame period ΔF in the exposure periods (e.g., exposure periods ΔTE1 and ΔTEk in FIG. 11) of portions of the lines. Even in this case, a captured image has dark streaks at the positions corresponding to lines in which light emission (i.e., light emission performed twice) for the 2-frame period ΔF is not captured.

In contrast, in the present embodiment, the driving signals that cause one of the pixels 11 to emit light many times by the active PWM drive method in the 1-frame period ΔF are outputted to the display panel 10. This allows one of the pixels 11 to emit light many times in the 1-frame period ΔF in the display panel 10 driven by the active PWM drive method. Accordingly, in a case where the display apparatus 1 is photographed by a camera, it is possible to capture light emission in each pixel 11 in the exposure period ΔTE. As a result, it is possible to suppress the occurrence of band-shaped luminance unevenness in an image resulting from the photography performed by the camera.

In addition, in the present embodiment, signals that cause the display panel 10 to alternately perform signal writing (plurality of write periods ΔTW) corresponding to the image signals Din and light emission (light emission periods ΔTL) in at least a portion of the 1-frame period ΔF are outputted as the driving signals. This eliminates the necessity to provide a continuous long period in the 1-frame period ΔF as the write period ΔTW. It is thus possible to prolong the total period of the light emission periods ΔTL in the 1-frame period ΔF. As a result, it is possible to offer the display apparatus 1 having high luminance with band-shaped luminance unevenness suppressed.

In the present embodiment, signals that cause the display panel 10 to emit light at the substantially equal intervals are also outputted as the driving signals. This makes it possible to make luminance unevenness less prominent even in a case where an image resulting from photography performed by a camera has band-shaped luminance unevenness.

In addition, in a case where the signals that satisfy Expressions (1) and (2) described above are outputted as the driving signals in the present embodiment, it is possible to suppress luminance unevenness to the extent of band unevenness that does not considerably degrade photographs. As a result, it is possible to offer the display apparatus 1 having high luminance with band-shaped luminance unevenness suppressed.

In addition, in a case where the signals that satisfy Expression (3) described above are outputted as the driving signals in the present embodiment, it is possible to suppress luminance unevenness to the extent of band unevenness that does not considerably degrade photographs. As a result, it is possible to offer the display apparatus 1 having high luminance with band-shaped luminance unevenness suppressed.

MODIFICATION EXAMPLES

Modification examples of the display apparatus 1 according to the embodiment described above will now be described.

Modification Example A

FIG. 12 illustrates a modification example of the voltage waveform of a signal inputted to the pixel 11, and modification examples of the voltage waveform and current waveform of a signal generated in each pixel 11. (a) of FIG. 13 is an enlarged view of a portion (portion surrounded by the dashed lines in FIG. 11) of the waveform of the saw signal S in FIG. 10. Each of (b), (c), and (d) of FIG. 13 is an enlarged view of the waveform of the output current Iout that is generated in response to the magnitude of the signal voltage Vsig.

In the present modification example, the controller 20 and the driver 30 have different lower limit values for a plurality of saw signals S (S0, S1, S2, and S3) included in the respective groups. For example, among the plurality of saw signals S (S0, S1, S2, and S3) included in the respective groups, the respective saw signals S (S0, S1, S2, and S3) have smaller lower limit values in order of the saw signal S (S0), the saw signal S (S1), the saw signal S (S2), and the saw signal S (S3). In the present modification example, the lower limit values of the saw signals S may be equal to each other between only portions (e.g., two) of the plurality of saw signals S (S0, S1, S2, and S3) included in the respective groups.

This allows the controller 20 and the driver 30 to adjust the lower limit values of the saw signals S in the driving signals, thereby outputting, to the display panel 10, signals that cause the pixels 11 relatively low in gray-scale to emit light a smaller number of times than the number of times the pixels 11 relatively high in gray-scale emit light. This makes it possible to reduce light emission luminance in low gray-scale as compared with a case where light is emitted a constant number of times irrespective of gray-scale. As a result, it is possible to improve the grade of images.

In the present modification example, when the plurality of saw signals S included in the 1-frame period ΔF is divided into a plurality of groups in the saw voltage Vsaw, for example, as illustrated in FIGS. 12 and 13, the width of at least one saw signal S (S0) out of the plurality of saw signals S (S0, S1, S2, and S3) included in the respective groups may be greater than the widths of the other saw signals S (S1, S2, and S3). Note that the saw signals S (S0, S1, S2, and S3) are arranged in order of the saw signal S (S0), the saw signal S (S1), the saw signal S (S2), and the saw signal S (S3) in the groups to which the saw signals S (S0, S1, S2, and S3) belong.

In such a case, it is possible for the controller 20 and the driver 30 to output, to the display panel 10, signals that make the widths of one or more output current pulses P3 corresponding to relatively wide saw signals S greater than the widths (i.e., length of the light emission period ΔTL) of one or more output current pulses P3 corresponding to relatively narrow saw signals S in the plurality of output current pulses P3 applied to the pixels 11 low in gray-scale. In other words, it is possible for the controller 20 and the driver 30 to output, to the display panel 10, signals that make one or more light emission periods ΔTL corresponding to relatively wide saw signals S longer than one or more light emission periods ΔTL corresponding to relatively narrow saw signals S in the plurality of light emission periods ΔTL of the pixels 11 low in gray-scale. It is possible for the controller 20 and the driver 30 to, for example, when the plurality of light emission periods ΔTL included in the 1-frame period ΔF is divided into a plurality of groups, make the widths of one or more of the plurality of light emission periods ΔTL included in the respective groups excluding at least one light emission period ΔTL greater than the widths of the other light emission periods ΔTL. This makes it possible to smoothly change the total value of the light emission periods ΔTL in the 1-frame period ΔF even if the number of times light is emitted is changed while gray-scale is changed.

Further, it is preferable that the controller 20 and the driver 30 make, for example, the widths of the lower end portions of the plurality of saw signals S (S0, S1, S2, and S3) included in the respective groups smaller than the recognition sensitivity ratio (e.g., 1% of the total value of the light emission periods ΔTL in the 1-frame period ΔF in the gray-scale of the lower end portions) of eyes. In such a case, even if the number of times light is emitted is changed while gray-scale is changed, a 1-level change in gray-scale is smaller than the recognition sensitivity ratio of eyes. Accordingly, it is possible to eliminate a discontinuous luminance change.

It is preferable in the present modification example that the controller 20 and the driver 30 output, to the display panel 10 as the driving signals, signals that exponentially change the total of light emission periods corresponding to one of the pixels 11 in the 1-frame period ΔF in response to a level of gray-scale. It is preferable that the gamma functions of the plurality of saw signals S (S0, S1, S2, and S3) included in the respective groups have the characteristics that the total of the gamma functions of the plurality of saw signals S (S0, S1, S2, and S3) included in the respective groups is expressed with an exponential function, for example, as illustrated in FIG. 14. In such a case, when especially a tiling display described below has a difference in luminance between cells adjacent to each other, it is possible to adjust luminance while keeping a constant change rate of luminance in any level of gray-scale.

Modification Example B

In the embodiment described above and the modification example thereof, the display panel 10 may be a tiling display including a plurality of cells 10B, for example, as illustrated in FIG. 15. The respective cells 10B are supported, for example, by a common support substrate 10A. Each cell 10B includes a component that is the same as that of the display panel according to the embodiment described above, for example. In the present modification example, the driver 30 is then provided for each cell 10B. The controller 20 controls each driver 30 as if the plurality of cells 10B were one display panel.

In this way, the display panel 10 is a tiling display in the present modification example. In this case, once the controller 20 and the driver 30 line-sequentially drive the respective cells 10B concurrently while a camera is photographing the display panel 10, following a vertical line that scrolls horizontally, a vertical line in a real image seems, to human eyes, a jagged vertical line, for example, as illustrated in FIG. 16.

In contrast, in the present modification example, the controller 20 and the driver 30 output, as the driving signals, signals for scanning, for each pixel row, the respective pixels 11 in the even-numbered columns or the odd-numbered columns, and then scanning, for each pixel row, the respective unscanned pixels 11 out of the respective pixels in the even-numbered columns and the odd-numbered columns, for example, as illustrated in FIGS. 17 and 18. Note that the thick frames in FIGS. 17 and 18 represent the selected pixels 11, and the gray-colored portions indicate the pixels 11 that have already been selected.

Specifically, the controller 20 and the driver 30 scan, for each pixel row, the respective pixels 11 in the even-numbered columns or the odd-numbered columns in order from the uppermost line side to the lowermost line side, and then scan, for each pixel row, the respective unscanned pixels 11 out of the respective pixels 11 in the even-numbered columns and the odd-numbered columns in order from the uppermost line side to the lowermost line side, for example, as illustrated in FIG. 17. Alternatively, the controller 20 and the driver 30 divide the plurality of pixels 11 into the upper half and the lower half, scan, for each pixel row, the respective pixels 11 in the even-numbered columns or the odd-numbered columns in the upper half in order from the uppermost line side to the middle line side, and concurrently scan, for each pixel row, the respective pixels 11 in the even-numbered columns or the odd-numbered columns in the lower half in order from the lowermost line side to the middle line side, for example, as illustrated in FIG. 18. Afterwards, the controller 20 and the driver 30 scan, for each pixel row, the respective unscanned pixels 11 out of the respective pixels 11 in the even-numbered columns and the odd-numbered columns in the upper half in order from the middle line side to the uppermost line side, and concurrently scan, for each pixel row, the respective unscanned pixels 11 out of the respective pixels in the even-numbered columns and the odd-numbered columns in the lower half in order from the middle line side to the lowermost line side, for example, as illustrated in FIG. 18.

In this case, the motion of vertical lines is delayed from regions of early writing to regions of subsequent writing in a horizontal scroll moving image. Accordingly, the even-numbered columns are distorted to delay the central portion of the image. The odd-numbered columns are distorted to delay the upper and lower portions of the image. These then seem to overlap each other to human eyes. For example, as illustrated in FIG. 19, these seem a moving image blur having partially different blur widths. However, a vertical line in a real image does not seem, to human eyes, a jagged vertical line as illustrated in FIG. 16. It is thus possible to suppress a vertical line in a real image seeming, to human eyes, a jagged vertical line as illustrated in FIG. 16.

Note that, in the present modification example, the controller 20 and the driver 30 may output, as the driving signals, signals for scanning, for each pixel row, the respective pixels 11 in a first pixel column or a second pixel column, and then scanning, for each pixel row, the respective pixels 11 in one of the first pixel column or the second pixel column that has not been scanned, for example. Even in such a case, it is possible to suppress a vertical line in a real image seeming, to human eyes, a jagged vertical line as illustrated in FIG. 16.

Alternatively, in the present modification example, the controller 20 and the driver 30 may output, as the driving signals, signals for scanning, for each pixel row, the respective pixels 11 in the first pixel column or the second pixel column in order from the uppermost line side to the middle line side and concurrently scanning, for each pixel row, the respective pixels 11 in the first pixel column or the second pixel column in order from the lowermost line side to the middle line side, and then scanning, for each pixel row, the respective pixels 11 in one of the first pixel column or the second pixel column that has not been scanned, in order from the middle line side to the uppermost line side and concurrently scanning, for each pixel row, the respective pixels 11 in one of the first pixel column or the second pixel column that has not been scanned, in order from the middle line side to the uppermost line side, for example. Even in such a case, it is possible to suppress a vertical line in a real image seeming, to human eyes, a jagged vertical line as illustrated in FIG. 16.

Alternatively, in the present modification example, the controller 20 and the driver 30 may output, as the driving signals, signals obtained by exchanging, for each frame, pixel columns (even-numbered pixel columns or odd-numbered pixel columns) to be first scanned, for example. For example, in FIGS. 17 and 18, the pixel columns to be first scanned are odd-numbered pixel columns. Accordingly, the controller 20 and the driver 30 may output, for example, driving signals for first scanning even-numbered pixel columns in the next frame. In such a case, it is possible to further suppress a vertical line in a real image seeming, to human eyes, a jagged vertical line as illustrated in FIG. 16.

In addition, in the present modification example, the controller 20 and the driver 30 output, as the driving signals, signals for scanning, for each pixel row, the respective pixels 11 in the even-numbered rows or the odd-numbered rows, and then scanning, for each pixel row, the respective unscanned pixels 11 out of the respective pixels 11 in the even-numbered rows and the odd-numbered rows, for example, as illustrated in FIGS. 20 and 21. Note that the thick frames in FIGS. 20 and 21 represent the selected pixels 11, and the gray-colored portions indicate the pixels 11 that have already been selected.

Specifically, the controller 20 and the driver 30 scan, for each pixel row, the respective pixels 11 in the even-numbered rows or the odd-numbered rows in order from the uppermost line side to the lowermost line side, and then scan, for each pixel row, the respective unscanned pixels 11 out of the respective pixels 11 in the even-numbered rows and the odd-numbered rows in order from the uppermost line side to the lowermost line side, for example, as illustrated in FIG. 20. Alternatively, the controller 20 and the driver 30 divide the plurality of pixels 11 into the upper half and the lower half, scan, for each pixel row, the respective pixels 11 in the even-numbered rows or the odd-numbered rows in the upper half in order from the uppermost line side to the middle line side, and concurrently scan, for each pixel row, the respective pixels 11 in the even-numbered rows or the odd-numbered rows in the lower half in order from the lowermost line side to the middle line side, for example, as illustrated in FIG. 21. Afterwards, the controller 20 and the driver 30 scan, for each pixel row, the respective unscanned pixels 11 out of the respective pixels 11 in the even-numbered rows and the odd-numbered rows in the upper half in order from the middle line side to the uppermost line side, and concurrently scan, for each pixel row, the respective unscanned pixels 11 out of the respective pixels in the even-numbered columns and the odd-numbered columns in the lower half in order from the middle line side to the lowermost line side, for example, as illustrated in FIG. 21.

In a case where scanning is performed as illustrated in FIG. 20, a horizontal scroll moving image seems to have a jagged moving image blur having a small amplitude, for example, as illustrated in FIG. 22A. In addition, in a case where scanning is performed as illustrated in FIG. 21, a horizontal scroll moving image seems to have a jagged moving image blur having partially different blur widths, for example, as illustrated in FIG. 22B. However, a vertical line in a real image does not seem, to human eyes, a jagged vertical line having a large amplitude as illustrated in FIG. 16. It is thus possible to suppress a vertical line in a real image seeming, to human eyes, a jagged vertical line as illustrated in FIG. 16.

Note that, in the present modification example, the controller 20 and the driver 30 may output, as the driving signals, signals for scanning, for each pixel row, the respective pixels 11 in a first pixel row or a second pixel row, and then scanning, for each pixel row, the respective pixels 11 in one of the first pixel row or the second pixel row that has not been scanned, for example. The controller 20 and the driver 30 may output, as the driving signals, signals for scanning, while skipping one or more pixel rows, the respective pixels 11 for each pixel row, and repeatedly scanning, while skipping one or more pixel rows, the respective pixels 11 for each pixel row until every pixel row is scanned, for example. Even in such a case, it is possible to suppress a vertical line in a real image seeming, to human eyes, a jagged vertical line as illustrated in FIG. 16.

Modification Example C

In the embodiment described above and the modification examples thereof, the display panel 10 may be configured to be able to perform light emission corresponding to image information (e.g., signal voltage Vsig having the voltage value corresponding to the image signal Din) of the previous frame while sampling image information (e.g., signal voltage Vsig having the voltage value corresponding to the image signal Din) of the current frame in each pixel 11.

In the present modification example, the pixel circuit 11A may include, for example, a plurality of memory circuits. The controller 20 and the driver 30 may then cause, for example, one or more first memory circuits serving as at least one of the plurality of memory circuits to hold a voltage obtained by sampling the signal voltage Vsig in the current frame, and cause one or more second memory circuits, different from the one or more first memory circuits, out of the plurality of memory circuits to hold a voltage obtained by sampling the signal voltage Vsig in the previous frame.

In the present modification example, the pixel circuit 11A may include, for example, two memory circuits 12 and 13, as described in FIG. 23. The controller 20 and the driver 30 may then cause, for example, one (e.g., memory circuit 12) of the two memory circuits 12 and 13 to sample the signal voltage Vsig in the current frame, and hold the sampled voltage. The controller 20 and the driver 30 may further cause, for example, the other (e.g., memory circuit 13) of the two memory circuits 12 and 13 to hold a voltage obtained by sampling the signal voltage Vsig in the previous frame, and output the held voltage to the positive input terminal of the comparator Comp. In such a case, it is possible for the controller 20 and the driver 30 to cause each pixel 11 to perform, a plurality of times, light emission based on the signal voltage Vsig in the previous frame, for example, in a 1-frame period while sampling the signal voltage Vsig in the current frame.

The memory circuit 12 includes, for example, a storage capacitor Cs1, and two switching transistors Tr3 and Tr4 coupled to the storage capacitor Cs1 in parallel. The switching transistor Tr3 is coupled to the data line Sig and one end of the storage capacitor Cs1. The switching transistor Tr4 is coupled to the positive input terminal of the comparator Comp, and one end of the storage capacitor Cs1.

The memory circuit 13 includes, for example, a storage capacitor Cs2, and two switching transistors Tr5 and Tr6 coupled to the storage capacitor Cs2 in parallel. The switching transistor Tr5 is coupled to the data line Sig and one end of the storage capacitor Cs2. The switching transistor Tr6 is coupled to the positive input terminal of the comparator Comp, and one end of the storage capacitor Cs2.

The switching transistor Tr3 samples the voltage (signal voltage Vsig) of the data line Sig, and writes the sampled voltage (input voltage Vin) into the storage capacitor Cs1. The switching transistor Tr4 controls the application of the signal voltage Vsig to the positive input terminal of the comparator Comp. Specifically, the switching transistor Tr4 writes a voltage (input voltage Vin) held in the storage capacitor Cs1 into the positive input terminal of the comparator Comp.

The switching transistor Tr5 samples the voltage (signal voltage Vsig) of the data line Sig, and writes the sampled voltage (input voltage Vin) into the storage capacitor Cs2. The switching transistor Tr6 controls the application of the signal voltage Vsig to the positive input terminal of the comparator Comp. Specifically, the switching transistor Tr6 writes a voltage (input voltage Vin) held in the storage capacitor Cs2 into the positive input terminal of the comparator Comp.

The storage capacitors Cs1 and Cs2 each hold the voltage (input voltage Vin) of the positive input terminal of the comparator Comp. The storage capacitors Cs1 and Cs2 each have a function of holding the voltage (input voltage Vin) of the positive input terminal of the comparator Comp in a constant level in a predetermined period.

FIG. 24 illustrates an example of a temporal change in light emission on the display panel 10 including a pixel in FIG. 2. As can be seen from FIG. 24, when the whole display panel 10 emits light, a portion of an image in an N-th frame is mixed with a portion of an image in a (N+1)-th frame in an image displayed on the display panel 10. Therefore, the border between the portion of the image in the N-th frame and the portion of the image in the (N+1)-th frame may be possibly prominent in the image displayed on the display panel 10.

In contrast, in the present modification example, while causing one (e.g., memory circuit 12) of the two memory circuits 12 and 13 to sample the signal voltage Vsig in the current frame (N-th frame), the controller 20 and the driver 30 cause the LED 11B of each pixel 11 to perform, a plurality of times, light emission based on a voltage (signal voltage Vsig in the previous frame (n−1)-th frame) held in the other (e.g., memory circuit 13) of the two memory circuits 12 and 13 in a 1-frame period, for example, as illustrated in FIGS. 25 and 26.

FIG. 25 exemplifies a state in which sampling is performed over a 1-frame period. FIG. 26 exemplifies a state in which sampling is performed in the first half of a 1-frame period. The upper portions of FIGS. 25 and 26 each illustrate an example of a temporal change in light emission on the display panel 10 according to the present modification example. The middle portions of FIGS. 25 and 26 each illustrate an example of a temporal change in the signal voltage Vsig held in the memory circuit 12. The lower portions of FIGS. 25 and 26 each illustrate an example of a temporal change in the signal voltage Vsig held in the memory circuit 13.

The memory circuit 12 in FIGS. 25 and 26 causes the switching transistor Tr3 in the frame period of the N-th frame to sample the signal voltage Vsig in the current frame (N-th frame), and causes, in the frame period of the (N+1)-th frame, the signal voltage Vsig in the previous frame (N-th frame) to be outputted to the positive input terminal of the comparator Comp via the switching transistor Tr4. In contrast, the memory circuit 13 in FIGS. 25 and 26 causes, in the frame period of the N-th frame, the signal voltage Vsig in the previous frame (N−1)-th frame) to be outputted to the positive input terminal of the comparator Comp via the switching transistor Tr6, and causes the switching transistor Tr5 in the frame period of the (N+1)-th frame to sample the signal voltage Vsig in the current frame (N+1)-th frame).

Note that the display panel 10 according to the present modification example may perform sampling and light emission for one frame at the frame rate (e.g., 240 Hz) that is the double of the frame rate (e.g., 120 Hz) in FIGS. 25 and 26, for example, as illustrated in FIG. 27.

FIG. 27 exemplifies a state in which sampling is performed over a 1-frame period. The upper portion of FIG. 25 illustrates an example of a temporal change in light emission on the display panel 10 according to the present modification example. The middle portion of FIG. 25 illustrates an example of a temporal change in the signal voltage Vsig held in the memory circuit 12. The lower portion of FIG. 25 illustrates an example of a temporal change in the signal voltage Vsig held in the memory circuit 13.

The memory circuit 12 in FIG. 27 causes the switching transistor Tr3 in the frame period of the N-th frame to sample the signal voltage Vsig in the current frame (N-th frame), and causes, in the frame period of the (N+1)-th frame, the signal voltage Vsig in the previous frame (N-th frame) to be outputted to the positive input terminal of the comparator Comp via the switching transistor Tr4. Further, the memory circuit 12 in FIG. 27 causes the switching transistor Tr3 in the frame period of the (N+2)-th frame to sample the signal voltage Vsig in the current frame (N+2)-th frame), and causes, in the frame period of the (N+3)-th frame, the signal voltage Vsig in the previous frame (N+2)-th frame) to be outputted to the positive input terminal of the comparator Comp via the switching transistor Tr4.

In contrast, the memory circuit 13 in FIG. 27 causes, in the frame period of the N-th frame, the signal voltage Vsig in the previous frame (N−1)-th frame) to be outputted to the positive input terminal of the comparator Comp via the switching transistor Tr6, and causes the switching transistor Tr5 in the frame period of the (N+1)-th frame to sample the signal voltage Vsig in the current frame (N+1)-th frame). Further, the memory circuit 12 in FIG. 27 causes, in the frame period of the (N+2)-th frame, the signal voltage Vsig in the previous frame (N+1)-th frame) to be outputted to the positive input terminal of the comparator Comp via the switching transistor Tr6, and causes the switching transistor Tr5 in the frame period of the (N+3)-th frame to sample the signal voltage Vsig in the current frame (N+3)-th frame).

In this way, in the present modification example, while image information (e.g., signal voltage Vsig having the voltage value corresponding to the image signal Din) of the current frame is sampled in each pixel 11, light emission corresponding image information (e.g., signal voltage Vsig having the voltage value corresponding to the image signal Din) of the previous frame held in each pixel 11 is performed a plurality of times in a 1-frame period. This prevents a portion of an image in an N-th frame and a portion of an image in a (N+1)-th frame from being mixed with an image displayed on the display panel 10 when the whole display panel 10 emits light. Thus, even in a case where the display panel 10 is, for example, a tiling display including the plurality of cells 10B, as illustrated in FIG. 15, it is possible to prevent a horizontal scroll moving image from being distorted.

In addition, in the present modification example, the signal voltage Vsig is sampled with one of the memory circuits 12 and 13, and the display panel 10 emits light with the other of the memory circuits 12 and 13. This allows the sampling cycle to be shorter more easily than in a case where these are performed with the same memory circuit. Thus, in a case where a high rate such as 240 Hz is set as the frame rate, the moving image characteristics are considerably improved. This allows the display apparatus 1 according to the present modification example to completely support VR (virtual reality).

Note that, in the present modification example, even while the controller 20 and the driver 30 are causing each pixel 11 to sample the signal voltage Vsig, for example, as illustrated in FIG. 28, the display panel 10 may be caused to emit light. It is then desirable to stabilize the ground potential, for example, while the display panel 10 is emitting light.

Alternatively, for example, the two memory circuits 12 and 13 may be coupled to fixed voltage lines that are different from the ground, and are more stable than the ground potential. In addition, the controller 20 and the driver 30 may apply noise in the same level to the ground and the fixed voltage lines to suppress the occurrence of a luminance shift, for example, when the signal voltage Vsig is sampled and the display panel 10 emits light.

In this way, light emission performed on the display panel 10 even at the time of sampling makes it possible to satisfy the following various requirements:

(1) To double (240 Hz) the frame rate (FIG. 28);

(2) To reduce the sampling rate of the signal voltage Vsig (FIG. 29);

(3) To reduce the current flowing in the LED 11B to reduce power consumption; and (4) To increase the light emission luminance of the display panel 10 by continuously emitting light.

The present disclosure has been described above with reference to the embodiment and the modification examples thereof, and the application examples and applications thereof. The present disclosure is not, however, limited to these embodiments or the like. A variety of modifications may be made. Note that the effects described herein are merely illustrative. The effects of the present disclosure are not limited to the effects described herein. The present disclosure may have effects other than the effects described herein.

For example, the present disclosure may also be configured as follows.

(1) A drive device including
an output unit that outputs a driving signal to a display panel including a plurality of pixels, the driving signal causing one of the pixels to emit light many times by an active PWM drive method in a 1-frame period.

(2) The drive device according to (1), in which the output unit outputs a signal as the driving signal, the signal causing the display panel to emit light at a substantially equal interval.

(3) The drive device according to (1) or (2), in which the output unit outputs a signal as the driving signal, the signal causing the display panel to alternately perform signal writing and light emission in at least a portion of the 1-frame period, the signal writing corresponding to an image signal.

(4) The drive device according to (2), in which the output unit outputs a signal as the driving signal, the signal satisfying the following expressions:

$$\Delta TEmin > 4 \times \Delta Te$$

$$\Delta Td \leq 2 \times \Delta Te$$

where $\Delta TEmin$ denotes a minimum exposure period of a CMOS sensor, $\Delta Te$ denotes a light emission cycle, and $\Delta Td$ denotes a period from a start of exposure of a first line to a start of exposure of a last line in the CMOS sensor.

(5) The drive device according to (2), in which the output unit outputs a signal as the driving signal, the signal satisfying the following expression:

$$\Delta Td/100 \leq \Delta Te$$

where $\Delta Td$ denotes a period from a start of exposure of a first line to a start of exposure of a last line in a CMOS sensor, and $\Delta Te$ denotes a light emission cycle.

(6) The drive device according to any one of (1) to (5), in which the output unit outputs a signal as the driving signal, the signal causing the pixel relatively low in gray-scale to emit light a smaller number of times than a number of times the pixel relatively high in gray-scale emits light.

(7) The drive device according to any one of (1) to (6), in which the output unit outputs a signal as the driving signal, the signal making, in a plurality of light emission periods of the pixel low in gray-scale, one or more light emission periods longer than another one or more light emission periods.

(8) The drive device according to any one of (1) to (7), in which the output unit outputs a signal as the driving signal, the signal exponentially changing a total of light emission periods of one of the pixels in a 1-frame period in response to a level of gray-scale.

(9) The drive device according to any one of (1) to (8), in which the output unit outputs, as the driving signal, a signal for scanning, for each pixel row, the respective pixels in a first pixel column or a second pixel column, and then scanning, for each pixel row, the respective pixels in one of the first pixel column or the second pixel column that has not been scanned.

(10) The drive device according to any one of (1) to (9), in which the output unit outputs, as the driving signal, a signal for scanning, for each pixel row, the respective pixels in a first pixel column or a second pixel column in order from an uppermost line side to a middle line side and concurrently in order from a lowermost line side to the middle line side, and then scanning, for each pixel row, the respective pixels in one of the first pixel column or the second pixel column that has not been scanned, in order from the middle line side to the uppermost line side and concurrently in order from the middle line side to the uppermost line side.

(11) The drive device according to (10), in which the output unit outputs, as the driving signal, a signal obtained by exchanging pixel columns for each frame, the pixel columns being configured to be first scanned.

(12) The drive device according to (1), in which the output unit outputs, as the driving signal, a signal for scanning, while skipping one or more pixel rows, the respective pixels for each pixel row, and repeatedly scanning, while skipping one or more pixel rows, the respective pixels for each pixel row until every pixel row is scanned.

(13) The drive device according to (12), in which the output unit outputs, as the driving signal, a signal for scanning, for each pixel row, the respective pixels in a first pixel row or a second pixel row in order from an uppermost line side to a lowermost line side, and then scanning, for each pixel row, the respective unscanned pixels out of the respective pixels in the first pixel row and the second pixel row in order from the uppermost line side to the lowermost line side.

(14) The drive device according to (13), in which the output unit outputs, as the driving signal, a signal obtained by exchanging pixel columns for each frame, the pixel columns being configured to be first scanned.

(15) The drive device according to (12), in which the output unit outputs, as the driving signal, a signal for scanning, for each pixel row, the respective pixels in a first pixel row or a second pixel row in order from an uppermost line side to a middle line side and concurrently in order from a lowermost line side to the middle line side, and then scanning, for each pixel row, the respective unscanned pixels out of the respective pixels in the first pixel row and the second pixel row in order from the middle line side to the uppermost line side and concurrently in order from the middle line side to the lowermost line side.

(16) The drive device according to (15), in which the output unit outputs, as the driving signal, a signal obtained by exchanging pixel columns for each frame, the pixel columns being configured to be first scanned.

(17) A display apparatus including:
a display panel including a plurality of pixels; and
a drive device that outputs a driving signal to the display panel, the driving signal causing one of the pixels to emit light many times by an active PWM drive method in a 1-frame period.

(18) The display apparatus according to (17), in which the display panel is configured to be able to perform light emission corresponding to image information of a current frame while holding image information of a next frame in each of the pixels.

(19) The display apparatus according to (18),
in which each of the pixels includes a plurality of memory circuits, and
the drive device causes one or more first memory circuits to hold a voltage obtained by sampling a signal voltage in a current frame, and causes one or more second memory circuits out of the plurality of memory circuits to hold a voltage obtained by sampling a signal voltage in a previous frame, the one or more first memory circuits serving as at least one of the plurality of memory circuits, the one or more second memory circuits being different from the one or more first memory circuits.

(20) The display apparatus according to (18),
in which each of the memory circuits includes a storage capacitor, and two switching transistors coupled to the storage capacitor in parallel,
one of the two switching transistors samples a signal voltage in the current frame, and
another of the two switching transistors outputs a held signal voltage in the previous frame.

This application claims the priority on the basis of Japanese Patent Application No. 2017-041965 filed on Mar. 6, 2017 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A drive device comprising
an output unit that outputs a driving signal to a display panel including a plurality of pixels, the driving signal causing one of the pixels to emit light many times by an active PWM drive method in a 1-frame period,
wherein the output unit outputs, as the driving signal, a signal for scanning, for each pixel row, the respective pixels in a first pixel column or a second pixel column in order from an uppermost line side to a middle line side and concurrently in order from a lowermost line side to the middle line side, and then scanning, for each pixel row, the respective pixels in one of the first pixel column or the second pixel column that has not been scanned, in order from the middle line side to the uppermost line side and concurrently in order from the middle line side to the uppermost line side.

2. The drive device according to claim 1, wherein the output unit outputs a signal as the driving signal, the signal causing the display panel to emit light at a substantially equal interval.

3. The drive device according to claim 2, wherein the output unit outputs a signal as the driving signal, the signal satisfying the following expression:

$$\Delta Td/100 \leq \Delta Te$$

where $\Delta Td$ denotes a period from a start of exposure of a first line to a start of exposure of a last line in a CMOS sensor, and $\Delta Te$ denotes a light emission cycle.

4. The drive device according to claim 1, wherein the output unit outputs a signal as the driving signal, the signal causing the display panel to alternately perform signal writing and light emission in at least a portion of the 1-frame period, the signal writing corresponding to an image signal.

5. The drive device according to claim 2, wherein the output unit outputs a signal as the driving signal, the signal satisfying the following expressions:

$$\Delta TEmin > 4 \times \Delta Te$$

$$\Delta Td \leq 2 \times \Delta Te$$

where $\Delta TEmin$ denotes a minimum exposure period of a CMOS sensor, $\Delta Te$ denotes a light emission cycle, and $\Delta Td$ denotes a period from a start of exposure of a first line to a start of exposure of a last line in the CMOS sensor.

6. The drive device according to claim 1, wherein the output unit outputs a signal as the driving signal, the signal causing the pixel relatively low in gray-scale to emit light a smaller number of times than a number of times the pixel relatively high in gray-scale emits light.

7. The drive device according to claim 1, wherein the output unit outputs a signal as the driving signal, the signal making, in a plurality of light emission periods of the pixel low in gray-scale, one or more light emission periods longer than another one or more light emission periods.

8. The drive device according to claim 1, wherein the output unit outputs a signal as the driving signal, the signal exponentially changing a total of light emission periods of one of the pixels in a 1-frame period in response to a level of gray-scale.

9. The drive device according to claim 1, wherein the output unit outputs, as the driving signal, a signal for scanning, for each pixel row, the respective pixels in a first pixel column or a second pixel column, and then scanning, for each pixel row, the respective pixels in one of the first pixel column or the second pixel column that has not been scanned.

10. The drive device according to claim 1, wherein the output unit outputs, as the driving signal, a signal obtained by exchanging pixel columns for each frame, the pixel columns being configured to be first scanned.

11. The drive device according to claim 1, wherein the output unit outputs, as the driving signal, a signal for scanning, while skipping one or more pixel rows, the respective pixels for each pixel row, and repeatedly scanning, while skipping one or more pixel rows, the respective pixels for each pixel row until every pixel row is scanned.

12. The drive device according to claim 11, wherein the output unit outputs, as the driving signal, a signal for scanning, for each pixel row, the respective pixels in a first pixel row or a second pixel row in order from an uppermost line side to a lowermost line side, and then scanning, for each pixel row, the respective unscanned pixels out of the respective pixels in the first pixel row and the second pixel row in order from the uppermost line side to the lowermost line side.

13. The drive device according to claim 12, wherein the output unit outputs, as the driving signal, a signal obtained by exchanging pixel columns for each frame, the pixel columns being configured to be first scanned.

14. The drive device according to claim 11, wherein the output unit outputs, as the driving signal, a signal for scanning, for each pixel row, the respective pixels in a first pixel row or a second pixel row in order from an uppermost line side to a middle line side and concurrently in order from a lowermost line side to the middle line side, and then scanning, for each pixel row, the respective unscanned pixels out of the respective pixels in the first pixel row and the second pixel row in order from the middle line side to the uppermost line side and concurrently in order from the middle line side to the lowermost line side.

15. The drive device according to claim 14, wherein the output unit outputs, as the driving signal, a signal obtained by exchanging pixel columns for each frame, the pixel columns being configured to be first scanned.

16. A display apparatus comprising:
a display panel including a plurality of pixels; and
a drive device that outputs a driving signal to the display panel, the driving signal causing one of the pixels to emit light many times by an active PWM drive method in a 1-frame period,
wherein the drive device outputs, as the driving signal, a signal for scanning, for each pixel row, the respective pixels in a first pixel column or a second pixel column in order from an uppermost line side to a middle line side and concurrently in order from a lowermost line side to the middle line side, and then scanning, for each pixel row, the respective pixels in one of the first pixel column or the second pixel column that has not been scanned, in order from the middle line side to the uppermost line side and concurrently in order from the middle line side to the uppermost line side.

17. The display apparatus according to claim 16, wherein the display panel is configured to be able to perform light emission corresponding to image information of a current frame while holding image information of a next frame in each of the pixels.

18. The display apparatus according to claim 17,
wherein each of the pixels includes a plurality of memory circuits, and
the drive device causes one or more first memory circuits to hold a voltage obtained by sampling a signal voltage in a current frame, and causes one or more second memory circuits out of the plurality of memory circuits to hold a voltage obtained by sampling a signal voltage in a previous frame, the one or more first memory circuits serving as at least one of the plurality of memory circuits, the one or more second memory circuits being different from the one or more first memory circuits.

19. The display apparatus according to claim 17,
wherein each of the memory circuits includes a storage capacitor, and two switching transistors coupled to the storage capacitor in parallel,
one of the two switching transistors samples a signal voltage in the current frame, and
another of the two switching transistors outputs a held signal voltage in the previous frame.

* * * * *